(12) United States Patent
Benesty et al.

(10) Patent No.: US 6,744,886 B1
(45) Date of Patent: Jun. 1, 2004

(54) ADAPTIVE FILTER UTILIZING PROPORTIONAL AFFINE PROJECTION ALGORITHM

(75) Inventors: Jacob Benesty, Summit, NJ (US); Tomas Fritz Gaensler, Watchung, NJ (US); Steven Leslie Gay, Long Valley, NJ (US); Man Mohan Sondhi, Mountain Lakes, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/227,327

(22) Filed: Jan. 6, 1999

(51) Int. Cl.$^7$ ................................................ H04M 9/08

(52) U.S. Cl. ........................... 379/406.08; 379/406.09; 708/322; 381/71.11; 381/71.12; 370/465

(58) Field of Search ...................... 379/406.01, 406.08, 379/406.09, 142.01, 142.13; 381/71.1, 71.11, 71.12, 71.14; 708/322, 323, 426; 370/466, 467, 468, 465; 375/232

(56) References Cited

U.S. PATENT DOCUMENTS

| | | | | |
|---|---|---|---|---|
| 5,272,695 A | * | 12/1993 | Makino et al. | 379/406.08 |
| 5,428,562 A | * | 6/1995 | Gay | 708/322 |
| 5,675,644 A | * | 10/1997 | Sih | 379/406.08 |
| 5,951,626 A | * | 9/1999 | Duttweiler | 708/322 |
| 6,108,412 A | * | 8/2000 | Liu et al. | 379/406.09 |
| 6,137,881 A | * | 10/2000 | Oh et al. | 379/406.08 |
| 6,198,819 B1 | * | 3/2001 | Farrell et al. | 379/406.08 |
| 6,246,760 B1 | * | 6/2001 | Makino et al. | 379/406.08 |
| 6,269,117 B1 | * | 7/2001 | Peng | 375/232 |

OTHER PUBLICATIONS

Duttweiler, D. C. "Proportionate Normalized Least–Mean–Squares Adaptation in Echo Cancelers," IEEE Transactions on Speech and Audio Processing, vol. 8, No. 5, Sep. 2000, pp. 508–518.*

Douglas, S. C. "A Family of Normalized LMS Algorithm," IEEE Signal Processing Letters, Vol 1, No. 3, Mar. 1997, pp. 49–5.*

Liu et al. "On the Use of a Modified Fast Affine Projection Algorithm in Subband for Acoustic Echo Cancelation," IEEE, Digita Signal Processing Workshop Proceedings, 1996, pp. 354–357.*

Tanaka et al. "Fast Projection Algorithm and its Step Size Control," ICASSP International Conference. Acoustics, Speech, a Signal Processing, vol. 2, May 1995, pp. 945–948.*

Douglas et al. "Normalized Data Nonlinearities for LMS Adaptation," IEEE Transactions on Signal Processing, vol. 42, No. 6 Jun. 1994, pp. 1352–1365.*

Oh et al. "A fast affine projection algorithm for an acoustic echo canceller using a fixed–point DSP processor," ICASSP IEEE Conf. Acoustics, Speech, and Signal Processing, Apr. 1997, pp. 4121–4124.*

* cited by examiner

*Primary Examiner*—Minsun Oh Harvey
*Assistant Examiner*—Con P. Tran

(57) ABSTRACT

An adaptive filter suitable for network echo cancellation and other applications contains a coefficient vector update device for feeding coefficient vector updates to a finite impulse response filter in accordance with fast converging algorithms. A double talk detector is included for causing filter adaptation to cease in the presence of double talk in the system being echo cancelled. The coefficient vector update device utilizes a proportional affine projection algorithm to provide fast convergence of the filter system and improved performance over other filter devices utilizing different fast converging algorithms.

5 Claims, 30 Drawing Sheets

| EQUATION | INSTRUCTIONS/SAMPLE | MEMORY LOC. |
|---|---|---|
| $\min(|e_n|, s_n)\text{sign}(e_n)$ | 3 | 2 |
| $s_{n+1} = \lambda s_n + \frac{k_0(1-\lambda)}{\beta}\min(|e_n|, s_n)$ | 4 | 2 |
| TOTAL | 7 | 4 |

ADAPTIVE FILTER UTILIZING PROPORTIONAL AFFINE PROJECTION ALGORITHM

FIELD OF THE INVENTION

This invention relates generally to the field of signal processing and in particular to adaptive filtering, and specifically to an adaptive filter utilizing a new fast converging algorithm that is well suited for network echo cancellation applications in a telephone network.

BACKGROUND OF INVENTION

Adaptive filters operate on a supplied signal in a prescribe manner such that a desired output signal is generated. Typically, adaptive filters generate a transfer function according to an algorithm that includes updating of the transfer function characteristic in response to an error signal. In this manner, the filter characteristic is optimized to produce a desired result.

When used in an echo canceller, an adaptive filter is used to generate an echo path estimate that is updated in response to an error signal. Echoes commonly occur because of imperfect coupling of incoming signals at the 4-to-2 wire junctions in communications systems. The echoes typically result because the impedance of the 2-wire facility is imperfectly balanced in the 4-to-2 wire junction, causing the incoming signal to be partially reflected over an outgoing path to the source of incoming signals.

Adaptive echo cancellers have been employed to mitigate the echoes by adjusting the transfer function (impulse response) characteristic of an adaptive filter to generate an estimate of the reflective signal or echo and, then, subtracting it from the outgoing signal. The filter impulse response characteristic and, hence, the echo estimate is updated in response to continuously updated samples of the outgoing signal for more closely approximating the echo to be cancelled.

Additionally, double talk detectors (DTD) are generally used to disable adaptation during double talk conditions, that is when both the near end and far end party to a telephone conversation taking place across a telephone line speak simultaneously. Because the double talk detector cannot disable adaptation at the precise instant the double talk occurs, a number of samples occur in the delay period between the commencement of actual double talk and the double talk detector shutting down adaptation. Samples taken during this delay period can and often do perturb the echo path estimate considerably. Also, characteristic changes in the system due to environmental or other causes can also perturb the filtering.

Thus, although prior art arrangements of adaptive filters perform satisfactorily in some applications, often it is impossible to simultaneously achieve both sufficiently fast response and the ability to resist perturbations caused by samples occurring prior to the cessation of adaptation.

SUMMARY OF THE INVENTION

The present invention overcomes shortcomings in the prior art. Specifically, the present invention is based upon a recognition that fast converging algorithms such as normalized least mean squares (NLMS), proportional normalized least mean squares (PNLMS) and a version which combines the two, specifically PNLMS++, are insufficient of themselves to resist perturbations in the echo path estimate resulting from disruptive samples collected in the echo canceller prior to the cessation of adaptation by the double talk detector. In addition to the fast conversion algorithms just discussed, there is another, known an affine projection algorithm (APA). In the present invention, a proportional affine projection algorithm (PAPA) is presented which combines APA and PNLMS++. This algorithm converges very fast, and unlike PNLMS++, is not as dependent on the assumption of a sparse echo response.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference numerals depict like elements throughout the several views.

DETAILED DESCRIPTION OF THE PREFERRED EMBODIMENTS

Figure 1:
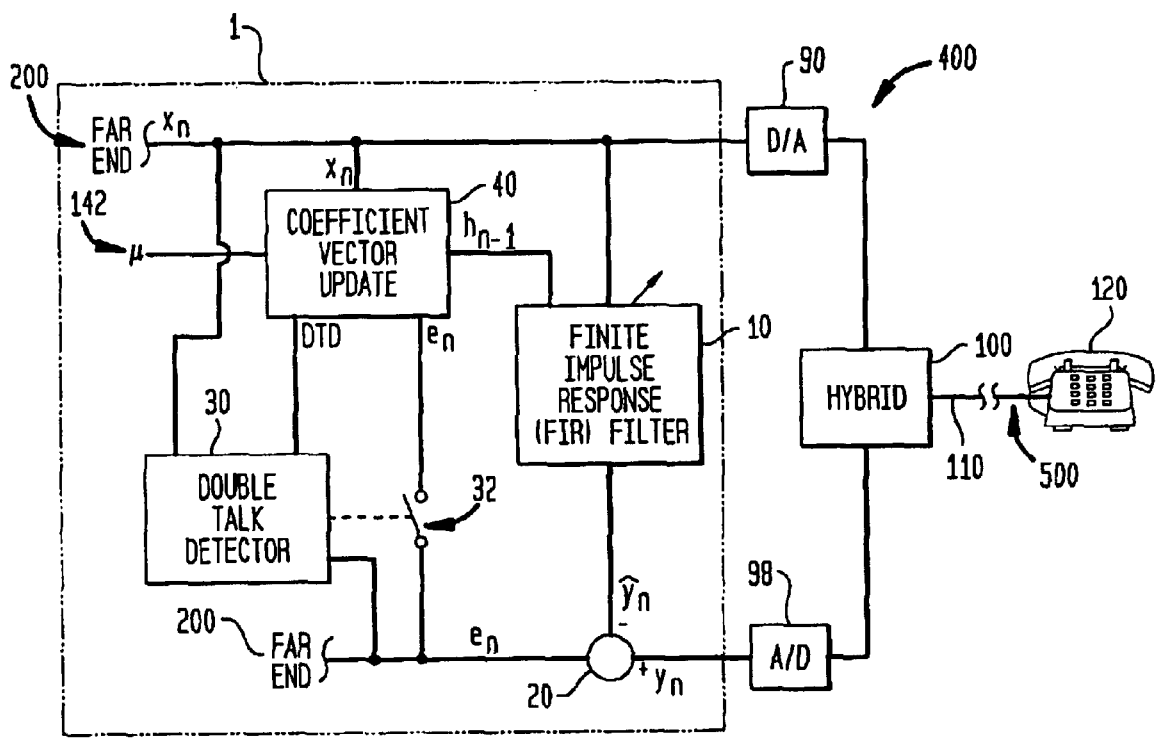
FIG. 1 is a simplified block diagram of an echo canceller suitable for utilizing the proportional affine projection algorithm (PAPA) disclosed herein.

With initial reference to FIG. 1, which is a schematic diagram of a preferred echo cancelling system in accordance with the present invention, there is shown, in a dashed line box, an echo canceller 1 forming a part of a network telephone circuit 400 which is connected via digital-to-analog (D/A) converter 90 to an analog hybrid 100 which connects, via local loop 110, to a telephone line or other telephone instrument 120 at a near end 500 in a manner known in the art. Communications from the near end pass through local loop 110 and through hybrid 100 through an analog-to-digital converter 98 for communication to a far end, represented generally at 200. Situated across the network circuit, in parallel to the hybrid 100, is a finite impulse response (FIR) filter 10 connected through summing node 20. In a manner known in the art, finite impulse response filter 10 attempts to duplicate the impulse response of any discontinuity at the hybrid connection point, thereby cancelling echoes. Finite impulse response filter 10 is an adaptive filter which receives its filter coefficients, at each sample interval, from coefficient vector update device 40. Coefficient vector update device 40 receives as its input an echo signal $e_n$, which is a residual echo signal, a step size variable $\mu$, 42, which, in a manner known in the art, effects the speed of convergence, and an excitation signal $x_n$ generally received from the far end 200.

A double talk detector 30 is also part of echo canceller 1 for controlling coefficient vector update device 40 by deactivating coefficient vector update device 40 during the occurrence of double talk. This effectively halts the adaptation taking place in finite impulse response filter 10. There is, however, a finite time delay between the actual onset of double talk and the effective discontinuance of adaptation in finite impulse response filter 10. Thus, while it is the goal of double talk detector 30 to in effect disconnect coefficient vector update device 40 from the circuit upon the detection of double talk, typically by setting the step size ($\mu$, 42) to zero, in actuality instantaneous response is presently unobtainable. Thus, the finite time that the double talk detector 30 needs to detect double talk is often enough to misalign the filter coefficients of coefficient vector update device 40 considerably. In other words, even a small error in the double talk detector 30 leads to relatively large errors in the adaptive coefficients provided to finite impulse response filter 10 by coefficient vector update device 40. Thus, the samples of echo signal $e_n$ obtained in coefficient vector update device 40 during the period of undetected double talk leads to significant misalignment of finite impulse response filter 10 which, upon activation of double talk detector 30 and the discontinuance of adaptation, remains frozen in a significantly non-adapted or divergent state. Under such circumstances, effective suppressions of residual echo cannot be obtained.

Figure 2:
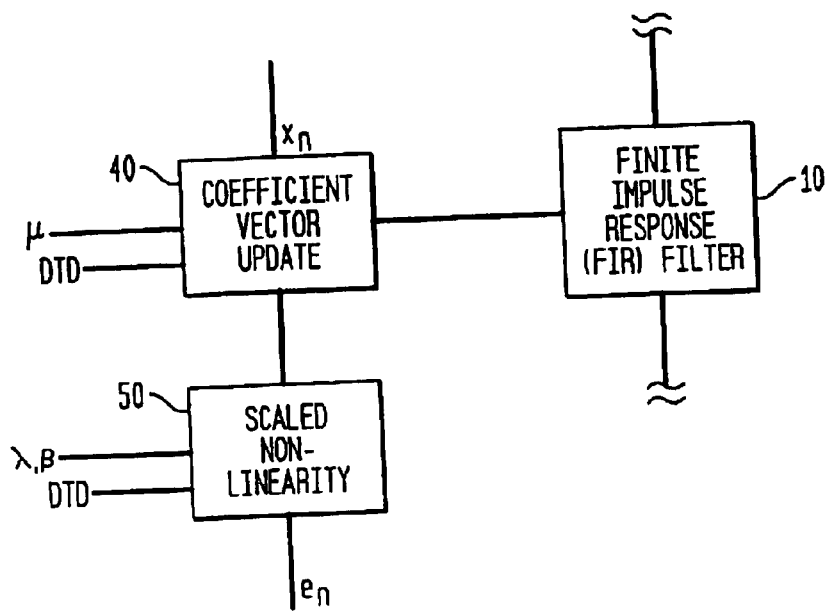
FIG. 2 is a detailed block diagram showing the block diagramatic representation of where in the echo canceller of the present invention the scaled non-linearity device should be inserted.
Figures 4, 5:
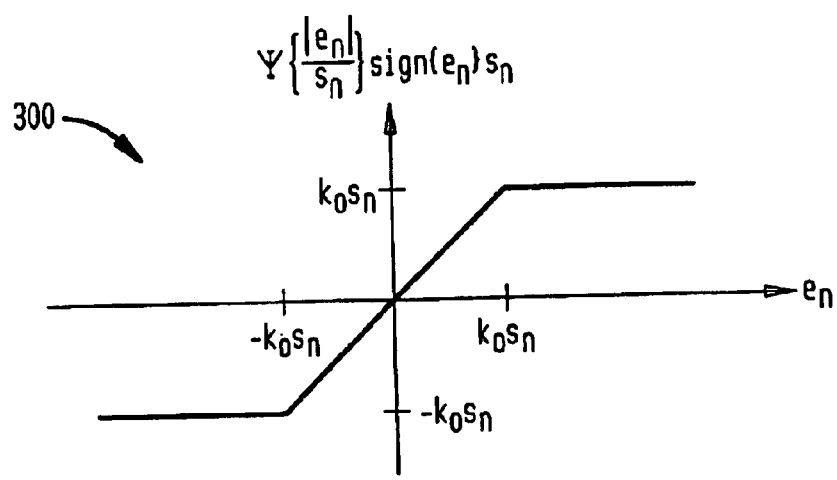
FIG. 4 is a graphical representation of a preferred scaled non-linearity which may be applied to the echo canceller of the present invention to improve robustness thereof.
FIG. 5 is a tabular example of the computational requirements for the scaled non-linearity.

Thus, in order to render echo canceller 1 more robust, that is more able to decelerate the divergence due to undetected double talk while maintaining good convergence for the echo canceller, an adaptive scaled non-linearity device 50, as seen in FIG. 2, is inserted in echo canceller 1 for application of an adaptive scaled non-linearity to error signal $e_n$ so as to reduce the impact of undetected double talk while maintaining fast convergence. With reference to FIG. 4, which will be discussed further below, a preferred adaptive scaled non-linearity 300 is graphically depicted.

Figure 3:
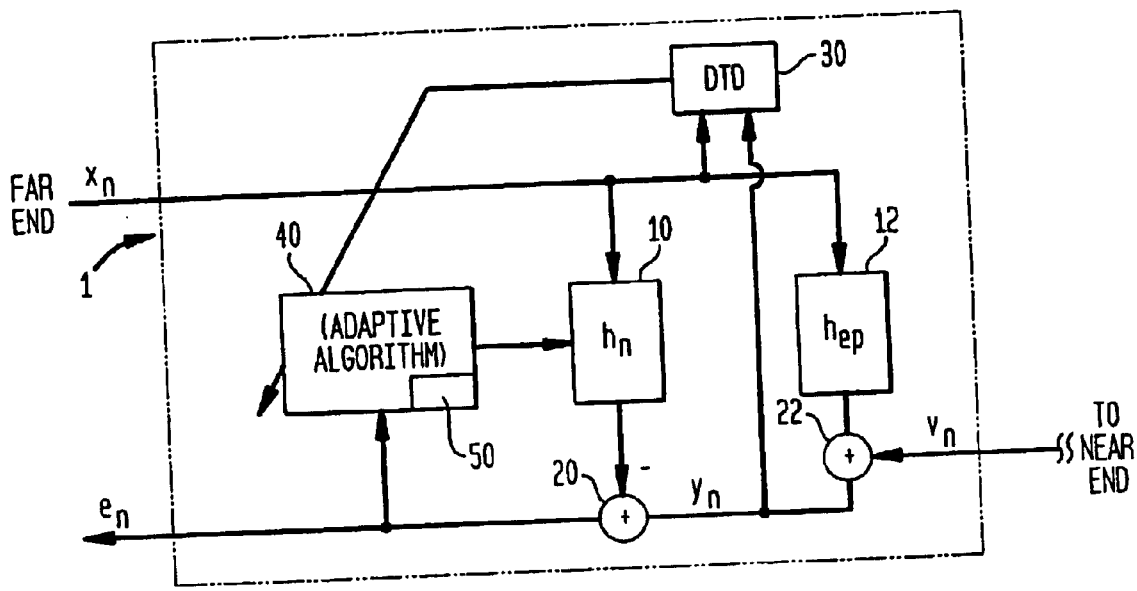
FIG. 3 is an alternative representation of the echo canceller of the present invention.

With reference now to FIG. 3, there is shown an alternate representation of echo canceller 1 in accordance with the present invention showing double talk detector 30 controlling coefficient vector update device 40 which generates filter coefficients for use by finite impulse response filter 10 by utilizing an adaptive algorithm incorporating the adaptive scaled non-linearity (e.g. FIG. 4) fed by adaptive scaled non-linearity device 50. True echo path 12 is representationally shown connected to the echo canceller through a representational summing node 22, at which point $v_n$ is shown as an input signal which includes background noise and possibly near-end signals from near end 500.

As mentioned above, it is preferable for the coefficient vector update device 40, which provides the adaptive filter coefficients utilized by the adaptive filter FIR 10, to provide for fast convergence through the use of fast converging algorithms. As used herein, the term coefficients of the adaptive filter, adaptive filter weights, filter taps and taps weights, shall be used interchangeably. Further, the following notations will be used consistently throughout herein:

$x_n$=Far-end signal, (1)

$v_n$=Background noise and possibly near-end signals, (2)

$y_n$=Echo and background noise possibly including near-end signal, (3)

$Y_n=[y_n \ldots y_{n-p+1}]^T$, vector of samples $y_n$, (4)

$x_n=[x_n \ldots x_{n-L+1}]^T$, Excitation vector, (5)

$X_n=[x_n \ldots x_{n-p+1}]$, Excitation matrix, (6)

$h_{ep}=[h_o, \ldots h_{L-1}]^T$, True echo path, (7)

$h_n=[h_{0,n}, \ldots, h_{L-1,n}]^T$, Estimated echo path, (8)

$\hat{h}n=[\hat{h}_{0,n}, \ldots, \hat{h}_{L-1,n}]^T$, An alternative coefficient vector for fast APA, (9)

$e_n=y_n-h_n^T x_n$, Residual echo, (10)

$e_n=Y_n-X_n^T h_n$, Residual echo vector, (11)

$z_{i,n}$=ith element in any arbitrary vector $z_n$. (12)

As used herein, L is the adaptive filter length and p is projection order of the APA. As discussed further below, only the preferred exemplary projection order p=2 is considered, it being recognized by the person of skill that other projection orders may be considered and utilized, as a matter of application specific design choice.

NLMS, PNLMS and PNLMS++

As mentioned above, it is preferred to use fast converging algorithms to drive FIR 10. Such algorithms may be, for example, NLMS and PNMLS, as set forth below:

$$h_{n+1} = h_n + \frac{\mu}{x_n^T x_n + \delta} x_n e_n, \quad NLMS \quad (13)$$

$$h_{n+1} = h_n + \frac{\mu}{x_n^T G_n x_n + \delta} G_n x_n e_n, \quad PNLMS \quad (14)$$

where $$G_n = \text{diag}\{g_{0,n}, \ldots, g_{L-1,n}\}, \quad (15)$$

is a diagonal matrix which adjusts the step-sizes of the individual taps of the filter 10, $\mu$ is the overall step-size parameter, and $\delta$ is a regularization parameter which prevents division by zero. The diagonal elements of $G_n$ are calculated as follows $$L_{max} = \max\{\delta_p, |h_{0,n-1}|, \ldots, |h_{L-1,n-1}|\}, \quad (16)$$

$$\gamma_i = \max\{\rho L_{max}, |h_{i,n-1}|\}, \quad 0 \leq i \leq L-1, \quad (17)$$

$$L_1 = i = \sum_{i=0}^{L-1} \gamma i, \quad (18)$$

$$g_i = \gamma_i / L_1, \quad 0 \leq i \leq L-1, \quad (19)$$

Parameters $\delta_p$ and $\rho$ are positive numbers with typical values $\delta_p = 0.01$, $\rho = 5/L$.

While these known fast converging algorithms are suitable in certain applications, an improvement over these two algorithms has been developed by personnel of the assignee called PNLMS++, which is set forth in *An Efficient, Fast Converging Adaptive Filter For Network Echo Cancellation*, published at Ascilomar Conference on Signal, Systems and Computers, Nov. 1–4, 1998, Pacific Grove, Calif., which in essence combines NMLS and PNMLS by utilizing one or the other in alternate time steps in the matrix $G_n$, as set forth below:

$$h_{n+1} = h_n + \frac{\mu}{x_n^T G_n x_n + \delta} G_n x_n e_n, \quad PNLMS \quad (14)$$

$G_n = \text{diag}\{g_{0,n}, \ldots, g_{L-1,n}\}$, diagonal individual step-size matrix (21)

$\mu$ is the overall step-size parameter and $\delta$ is the regularization parameter that prevents division by zero. For odd-numbered samples the diagonal entries of the step-size matrix, $G_n$ are calculated as follows, which yields PNLMS;

$$h_{max} = \max\{\delta_p, |h_{0,n-1}|, \ldots, |h_{L-1,n-1}|\}, \quad (22)$$

$$\gamma_{i,n} = \max\{\rho h_{max}, |h_{i,n-1}|\}, \quad 0 \leq i \geq L-1, \quad (23)$$

$$g_{i,n} = \gamma_{i,n} / \sum_{i=o}^{L-1} \gamma_{i,n}, \quad 0 \leq i \leq L-1. \quad (24)$$

For even samples, $$G_n = I \quad (25)$$

which results in an NLMS step. Parameters $\delta_p = 0.01$, and $\rho$ are positive numbers with typical values $\delta_p = 0.01$, $\rho = 5/L$.

PAPA

Another type of known fast converging algorithm is the Affine Projection Algorithm (APA), which is a special case of NLMS, but recognizably faster. This may be combined with the proportional step size of PNLMS to yield a new, improved fast converging algorithm referred to herein as Proportional Affine Projection Algorithm (PAPA). This new algorithm is set forth below as:

$$h_{n+1} = h_n + \frac{\mu}{x_n^T G_n x_n + \delta} G_n x_n e_n, \quad PNLMS++ \quad (20)$$

where $G_n$ is as defined in the last section and $(X_n^T X_n + \delta i)^{-1}$, is an estimate of the inverse correlation matrix of the input signal, $$R_{xx,n}^{-1} = \begin{bmatrix} r11,n & r[[,]]12,n \\ r12,n & r22,n \end{bmatrix}^{-1} = (X_n^T X_n + \delta I)^{-1}. \quad (27)$$

This matrix "whitens" the input data, $X_n$, and thus the convergence rate of the adaptive filter is increased. With $G_n = 1$, equation (26) reduces to the standard, known APA. As evident, and as mentioned above, PAPA is obtained by combining APA with the proportional step-size of PNLMS++. Note, however, that it is preferable to omit the matrix $G_n$ in the definition of $R_{xx,n}$ to save computations. Inclusion of the matrix requires an additional 4L multiplications per sample, but it is believed that the effect on filter performance is minimal. Thus omission or inclusion of the matrix is an application specific matter of design choice.

Additionally, the choice of order of projection in the APA is governed by the properties of the input signal. For speech, an order of 6 to 10 would seem appropriate since it is known in the art that short term properties of speech are well modeled by an auto regressive process of that order. However, it is also known that choosing a low value for the order (e.g. 2) yields a practical algorithm with low complexity yet fast convergence rate. With an order of 2, it is also easy to maintain the numerical stability of the algorithm.

As seen in FIGS. 1 and 3, a double talk detector (DTD) 30 is a part of echo canceller 1 and disables coefficient vector update device 40, albeit imperfectly. By way of example, a simple and efficient way of detecting double-talk in DTD 30 is to compare the magnitude of the far- and near-end signals and declare double-talk if the near-end magnitude becomes larger than a threshold value set by the far-end signal, (1). That is, if $$|y_n| \geq \frac{1}{2} \max\{|x_n|, |x_n - 1|, \ldots, |x_{n-L+1}|,\} \quad (28)$$

double-talk is declared. A so called hangover time, $T_{hold}$, is also included which means that if double-talk is detected, adaptation of the filter 10 is inhibited for this pre-specified duration beyond the end of double-talk.

R-NLMS, R-PNLMS and R-PNLMS++

However, and as mentioned above, there is a finite period of time from the commencement of double-talk and the point when DTD 30 disables adaptation in coefficient vector update device 40. It is therefore desirable to make the aforementioned fast converging algorithms robust, i.e resistant to near end disturbances, whether introduced by undetected double talk or other system perturbations.

Specifically, both the NLMS algorithm and the PNLMS algorithm can be made robust to large disturbances by a modification of the optimization criterion on which these algorithms are based. Recall that the LMS is an iterative algorithm to adjust the estimated impulse response so as to minimize the cost function, $E\{|e_n|^2\}$, the mean square error. Each iteration updates the current estimate of $h_n$, by $\mu x_n e_n$, which is a step in the direction of a stochastic approximation to the gradient of $E\{|e_n|^2\}$. To make the algorithm insensitive to changes of the level of input signal, $x_n$ the proportional factor $x_n$ is normalized, resulting in the NLMS algorithm in (13). It will be recognized by the person of skill, utilizing the teachings herein, that other gradient algorithms can be derived by changing the cost function to $$J(e_n) = E\left\{\varrho\left(\frac{|e_n|}{s}\right)\right\} \tag{29}$$

where $\varrho(.)$, and hence $J(e_n)$, is any symmetric function with a monotonically non-increasing derivative (with respect to its argument). More generally, one can use M-estimators which are defined as $$J(e_n) = \sum_n \varrho\left(\frac{|e_n|}{s}\right).$$

The choice used in (29) makes the derivation of the iterative algorithm more consistent with the derivation of the LMS algorithm. In any case, the resulting algorithm, analogous to the steepest-descent method is $$h_n += h_n - \mu \nabla_h J(e_n). \tag{30}$$

The algorithm can be made robust by a proper choice of $J(e_n)$, which must be chosen such that $\lim_{e_n \to \infty} |\nabla_h J(e_n)| \leftarrow \infty$. It is known that one might choose $\nabla_h J(e_n) = E\{-x_n \text{sign}(e_n) \psi$ $$\left(\frac{|e_n|}{s}\right) s\},$$

where $\psi$ is a hard limiter;

$$\psi\left(\frac{|e_n|}{s}\right) = \min\left\{k0, \left(\frac{|e_n|}{s}\right)\right\}, \tag{31}$$

and s is a very important scale factor. The effect of this scale factor, and the manner in which it is adapted, is discussed further below. When the Gauss-Newton method is utilized to derive the iterative algorithm it is found that the inverse Hessian of the minimization criterion (29) ($\{\nabla_h^2$ should be used as a step-size matrix. The Hessian is straightforwardly found as $$\nabla_h^2 J(e_n) = E\left\{\frac{x_n x_n^T}{s^2} \psi'\left(\frac{|e_n|}{s}\right)\right\}, = \frac{\zeta}{s^2} R_{xx}, \tag{32}$$

i.e. a constant ($\zeta$) times the correlation matrix ($R_{xx}$) of the input signal. This result comes from our choice of criterion, (12), whose derivative is either zero or one depending on the magnitude of $e_n/s$. The inverse of the correlation matrix is far too complex to be used for normalization so it is instead preferably approximated as a diagonal matrix, and use a stochastic approximation of the gradient is used, leading to the robust NLMS algorithm, $$h_{n+1} = h_n + \frac{\mu}{x_n^T x_n + \delta} x_n s \psi\left(\frac{|e_n|}{s}\right) \text{sign}\{e_n\}. \tag{33}$$

The PNLMS algorithm given in (2) can be made robust in an exactly analogous manner, yielding the update equation, $$h_{n+1} = h_n + \frac{\mu}{x_n^T G_n x_n + \delta} G_n x_n s \psi\left(\frac{|e_n|}{s}\right) \text{sign}\{e_n\}. \tag{34}$$

Alternating the iterations with Gn as given in (24) and (25) yields the robust PNLMS++ algorithm.

The estimate of the scale factor, s, should reflect the background noise level at the near-end, be robust to shorter burst disturbances (double-talk) and track longer changes of the residual error (echo path changes). Therefore it is preferable to chose the scale factor estimate as, $$s_{n+1} = \lambda s n + \frac{1-\lambda}{\beta} s n \psi\left(\frac{|e_n|}{s}\right), \tag{35}$$

$$s_0 = \sigma_x,$$

which is very simple to implement. The choice of this method of estimating s is justified, as set forth further below. With this choice, the current estimate of s is governed by the level of the error signal in the immediate past over a time interval roughly equal to $1/(1-\lambda)$. When the algorithm has not yet converged, s is large. Hence the limiter is in its linear portion and therefore the robust algorithm behaves like the conventional NLMS or PNLMS algorithms. When double-talk occurs, the error is determined by the limiter and by the scale of the error signal during the recent past of the error signal before the double-talk occurs. Thus the divergence rate is reduced for a duration of about $1/(1-\lambda)$. This gives ample time for the DTD 30 to act. If there is a system change, the algorithm will not track immediately. As the scale estimator tracks the larger error signal the nonlinearity is scaled up and convergence rate accelerates. The trade off between robustness and tracking rate of the adaptive algorithm supplied by coefficient update device 40 to FIR 10 is thus governed by the tracking rate of the scale estimator which is controlled by one single parameter, $\lambda$.

As mentioned above, a scale factor, s, can be found by defining the implicit function of s given by, $$J_2(n) = \sum_{l=0}^{n} \lambda_1^{n-1} x\left(\frac{|e_l|}{s}\right) = 0, \tag{36}$$

where s is the scale factor, $\lambda_1$, a forgetting factor. One may chose ($\cdot$) as, $$\chi(\cdot) = \psi(\cdot) - \beta, \tag{37}$$

because $\psi(\cdot)$ is already calculated in (34). The choice of $\chi(\cdot)$ is also not very critical. For normalization, $\beta$ is chosen such that for a Gaussian process [z ∈ N {0,1}], $$E\{\chi(z)\} = O.$$

This gives $$\beta = \frac{2}{\sqrt{2\pi}} \int_o^\infty \psi\{z\} e^{-\frac{1}{2}z^2} dz \quad (38)$$

$$= \frac{2}{\sqrt{\pi}} \left(1 - e^{-\frac{1}{2}K_0^2}\right) + k_o \, erfc\left(\frac{k_o}{\sqrt{2}}\right) \text{ where}$$

$$erfc(x) = \frac{2}{\sqrt{\pi}} \int_x^\infty e^{-t^2} dt. \quad (39)$$

This choice leads to a scale estimate $s=\sigma_v$ for Gaussian noise upon convergence. The purpose of the scale factor is multifold. Traditionally the scale is used to make a robust algorithm, e.g. (34), invariant to the background noise level. In this case the noise and the echo path to be identified are assumed stationary. In echo cancelling however, it is desirable that the scale factor tracks nonstationary background noise as well as scales the nonlinearity appropriately so that the canceller is robust to double-talk bursts. Consequently the tracking rate of the scale estimator controls both convergence rate and robustness of the algorithm, (34). A recursive scale estimator is derived with a Gauss-Newton technique in the same fashion as the R-PNLMS++ algorithm discussed above and further below. Thus let $$s_{n+1} = s_n - (\nabla_s \hat{J}_2(n))^{-1} \hat{J}_2(n). \quad (40)$$

The gradient of (36) is $$\nabla_s J_2(n) = \sum_{t=0}^n -\lambda_t^{n-1} \frac{|e_t|}{s^2} \chi'\left(\frac{e_t}{s}\right) = -\frac{1}{s}\left[\frac{|e_n|}{s^2}\chi'\left(\frac{e_n}{s}\right) + b_{n-1}\right] = -\frac{1}{s} b_n. \quad (41)$$

Let $$\hat{J}_2(n) = \chi\left(\frac{|e_n|}{s_n}\right)$$

and $\nabla_s \hat{J}(n) = \nabla_s J_{2(n)}$. A recursive least squares type of algorithm then becomes $$s_{n+1} = s_n + \frac{s_n}{b_n} \chi\left\{\frac{|[[[]]e_n|}{s_n}\right\} \quad (42)$$

$$b_{n+1} = \lambda_1 b_n + \frac{|e_n|}{s_n} \chi'\left\{\frac{|e_n|}{s_n}\right\}. \quad (43)$$

The complexity of this algorithm is reduced by using the following assumptions: $\nabla_s \hat{J}(n)$ is considered stationary and $s_n$ converges to the background standard deviation of the noise (Gaussian), then $$E\{\nabla_s \hat{J}_2(n)\} = \sum_{t=0}^n -\lambda_1^{n-t} E\left\{\frac{|e_t|}{s^2} \chi'\left(\frac{|e_t|}{s}\right)\right\} \quad (44)$$

$$\rightarrow -\frac{1}{s} \frac{\alpha}{1-\lambda_1}, n \rightarrow \infty \quad (45)$$

$$\alpha = \sqrt{\frac{2}{\pi}} \left(1 - e^{-\frac{1}{2}k_0^2}\right) \quad (46)$$

Combining (37), (40) and (45) leads to $$s_{n+1} = s_n + \frac{(1-\lambda_1)sn}{\alpha}\left\{\psi\left(\frac{|e_n|}{s_n}\right) - \beta\right\} \quad (47)$$

$$= \left(1 - \frac{\beta}{\alpha}(1-\lambda_1)\right)s_n + \frac{(1-\lambda_1)s_n}{\alpha}\left\{\psi\left(\frac{|e_n|}{s_n}\right)\right\} \quad (48)$$

$$= \lambda sn + \frac{(1-\lambda \geq \lambda}{\beta} 1 - s_n \psi\left(\frac{|e_n|}{s_n}\right), \quad (49)$$

$$= 1 - \frac{\beta}{a}(1-\lambda_1). \quad (50)$$

Thus, as mentioned above, R-PNLMS++ is a robust algorithm that combines R-NLMS and R-PNLMS. That is, it uses the same step-size matrix $G_n$ as discussed above, and the coefficient update equation is $$\phi(|e_n|) = \min\{|e_n|, s_n k_0\}, \quad (51)$$

$$h_{n+1} = h_n + \frac{\mu}{x_n^T G_n x_n + \delta} G_n x_n \phi(|e_n|\text{sign}\{e_n\}, \text{ R-PNLMS+++} \quad (52)$$

$$s_{n+1} = \lambda_{sn} + \frac{(1-\lambda)}{\beta} \phi(|e_n|), \quad (53)$$

where $\psi(\cdot)$ is a hardlimiter or Huber function and $s_n$ is a scale factor. The preferred function $\psi(|e_n|)\text{sign}\{e_n\}$ is shown in FIG. 4. $k_0$ and $\lambda$ are constants that control the robustness and convergence rate of the algorithm. $\beta$ is chosen such that if the disturbing signal $v_n$ is zero-mean white Gaussian noise with variance $\sigma_v$, then $s_n \rightarrow \sigma v$, as $n \rightarrow \infty$. In practice it may also be useful to bound the minimum value that $s_n$ can converge to. This value is referred to as $s_{min}$ and should preferably be chosen in the same range as $\sigma_v$.

R-PNLMS++ SIMULATIONS

Simulations of the above may be considered, by way of non-limiting example, to further set forth the preferred embodiments of the echo canceller 1 of the present invention and to exemplify the coupling between the DTD 30 and the coefficient vector update device 40 utilizing R-PNLMS++. In these exemplary simulations set forth below and in the referenced drawing figures, the known Geigel DTD is used. The exact coupling and settings of the DTD 30 and adaptive algorithms utilized by coefficient vector update device 40 are given in the following as well. In all the simulations, the sampling rate is 8 kHz. Two hangover times are used, one for the DTD, $T_{hold}=240$ (30 ms), and one for the scale factor $T_{hold,scale}=4T_{hold}$. The reason for using a longer hangover time for the scale factor is to avoid undetected double-talk intervals, which may increase the divergence rate of the robust algorithms. Also, when the scale hangover counter (Count$_{scale}$) is larger than zero, the scale factor is forced to approach a prespecified value, $s_{min}$, by the constant $\psi_c \leq s_{min} \beta$. $s_{min}$ is an estimate of the standard deviation background noise. It has the effect that robustness is maintained if double-talk goes on for a longer period of time. The double-talk detection hangover time is controlled by the variable Counthold, an exemplary form of calculating same being set for below:

$$\text{if } |y_n| \geq \frac{1}{2}\max\{|x_n|, |x_n - 1|, \ldots, |x_{n-L+1}|\} \bigg| \text{ or Count}_{hold} > 0 \quad (54)$$

$$\mu = 0;$$

$$\text{if}(Count_{hold} \leq 0)$$

-continued $Count_{hold} = 240;$ $Count_{scale} = 960;$ else $Count_{hold} = Count_{hold} - 1;$ $Count_{scale} = Count_{scale} - 1;$ end else $\mu = 0.2;$ if $Count_{scale} > 0$ $Count_{scale} = Count_{scale} - 1;$ end end Update eq. (15: R-PNLMS++, if $Count_{scale} \leq 0)$ $\psi_n = sign(e_n)\min\{|e_n|, s_n\};$ $s_{n+1} = \lambda_{sn} + \dfrac{k_0(1-\lambda)}{\beta}\psi_n;$ else $s_{n+1} = \lambda_{sn} + \dfrac{k_0(1-\lambda)}{\beta}\psi_c$ end The DTD 30 and scale estimator could share the same hangover counter. Estimating the scale s as shown above in equation in (54) instead of (35) reduces complexity. Exemplary extra computations for introducing robustness are given in FIG. 5. This amounts to less than 0.3% of the total load for a PNLMS++ algorithm with L=512.

R-PNLMS++ EXPERIMENT

Experiments were carried out utilizing NLMS, PNLMS and R-PNLMS++ to show the performance improvements that may be realized utilizing a preferred robust fast converging algorithm such as R-PNLMS++ in coefficient vector update device 40.

The three algorithms, NLMS, PNLMS++ and R-PNLMS++ are evaluated using white Gaussian noise as signals. An example of the performance for a speech signal is also shown. General parameter settings are $\mu$=0.2, L=512 (64 ms), $\delta$=20000, $\delta_p$=0.01, $\rho$=−0.01

$\sigma_x$=1900, SNR=39 dB (echo-to-noise ratio).

All three algorithms achieve a minimum mean square error of −49 dB.

Hybrid attenuation: 20 dB.

a Geigel detector assumes 6 dB attenuation.

Two sets of parameters for the robust algorithm are shown, $(\lambda, k_0)$=(0.997, 1.1)(0.995, 1.5). These choices result in [$\beta$≈0.73927, ($\lambda$=0.996)].

Figure 6A:
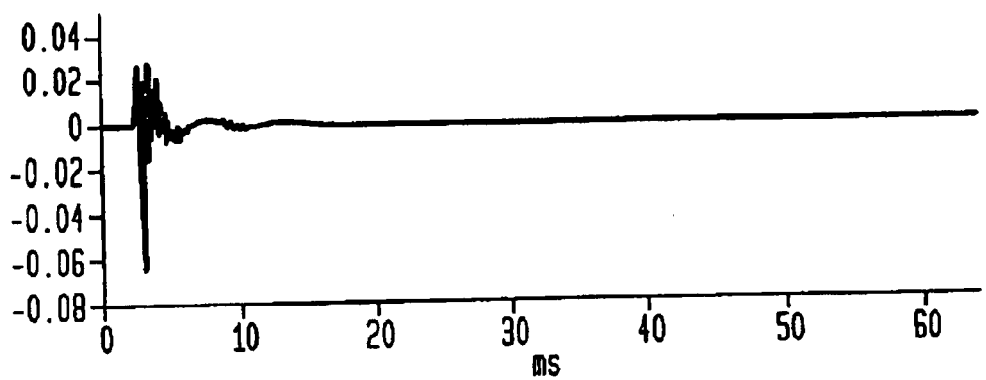
FIGS. 6a and b are graphical representations of the impulse response and magnitude of the frequency response, respectively, of an exemplary hybrid utilized for performance simulations of the present invention.
Figure 6B:
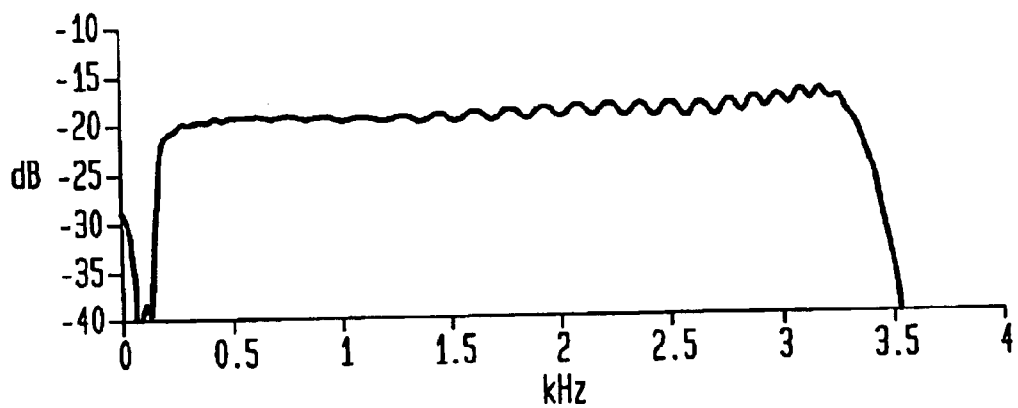

FIG. 6 shows the impulse response, $h_{ep}(l)$, l=0, and the amplitude function of the sparse hybrid used in the simulations. Four kinds of experiments are carried out in order to illuminate the operation of the R-PNLMS++ versus PNLMS++ and NLMS during double-talk, re-convergence and continuous tracking. As performance measures, the misalignment and mean square-error (MSE) are used, $$Misalignment(n) = 10\log_{10}\left\{\dfrac{\|h_{ep} - h_n\|^2}{\|h_{ep}\|^2}\right\}, \quad (55)$$

$$MSE(n) = 10\log_{10}\left\{\dfrac{\langle|yn - vn - h_n^T xn|^2\rangle}{\langle|yn - vn|^2\rangle}\right\}, \quad (56)$$

The average, < >, is taken over about 1000 samples. This length of averaging is necessary in order to reduce the variance in the figures and it does not significantly affect the convergence rate in the figures.

(i) Double-talk Bursts With the DTD Either Switched Off or On

Figure 7A:
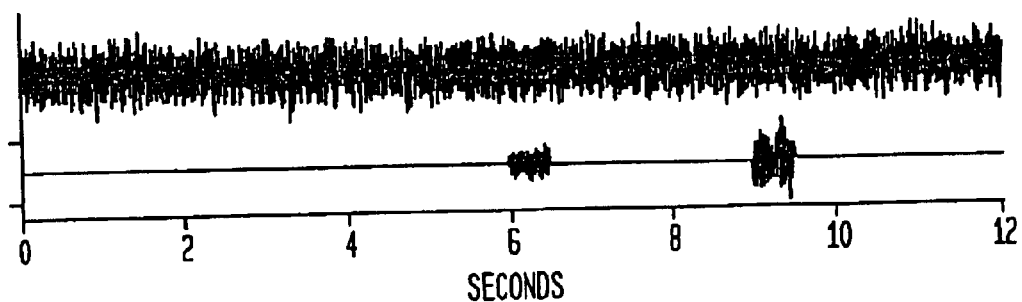
FIGS. 7(a) to 7(c) are a group of graphs indicating performance results of a first embodiment of the present invention; Performance during double-talk for parameter setting $\lambda=0.997$, $k_0=1.1$ (a) Far- and near-end signals. Far- and near end ratio: 30 dB (3–3.5 s), (6–6.5 s), 0 dB (9–9.5 s). (b) Misalignment without double-talk detector. (c) Misalignment with double-talk detector. Solid line: R-PNLMS++, Dashed line: PNLMS++, Dotted line: NLMS. The small vertical bars indicate when double-talk is declared.
Figure 7B:
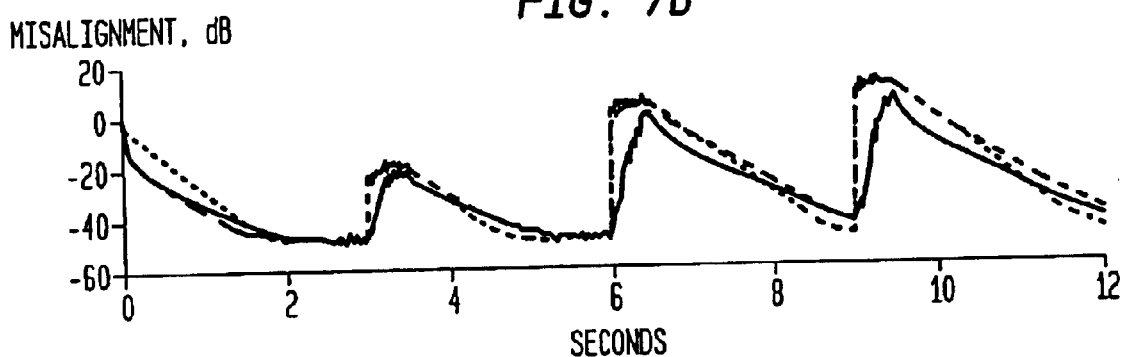
Figure 7C:
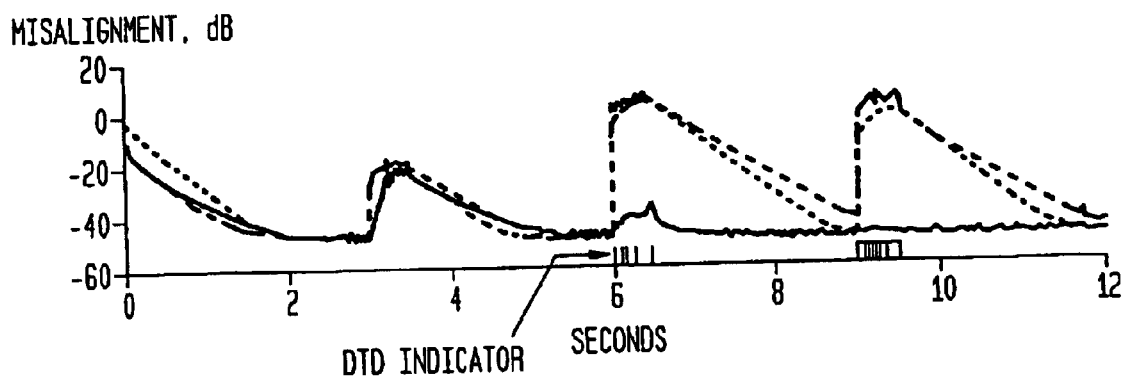

Half-second bursts of double-talk are introduced at times 3, 6, and 9 seconds of levels 30, 6, and 0 dB, respectively, below the far-end speech. FIG. 7 shows the far- and near-end signals and the misalignment for parameter setting $\lambda$=0.997 and $k_0$=1.1. The divergence rates of the algorithms do not strongly depend on the power of the near-end signal. Even when the DTD 30 is used as in FIG. 7c, PNLMS++ and NLMS diverge at both 6 and 9 s. The DTD 30 does not inhibit adaptation until 122 samples of double-talk have entered the algorithms (at 6 s) and this is enough to drive the filters far from their optimal setting. R-PNLMS++ is not affected by these samples. A number of detection misses between 3–3.5 s slightly perturbs the robust estimate. At 9 s, the DTD 30 reacts fast at the start of double-talk but makes a detection error only a few samples long after the first hangover time. This detection error causes the non robust algorithms to diverge. The R-PNLMS++ is not influenced by the detection error occurring between 9–9.5 s.

Figure 8A:
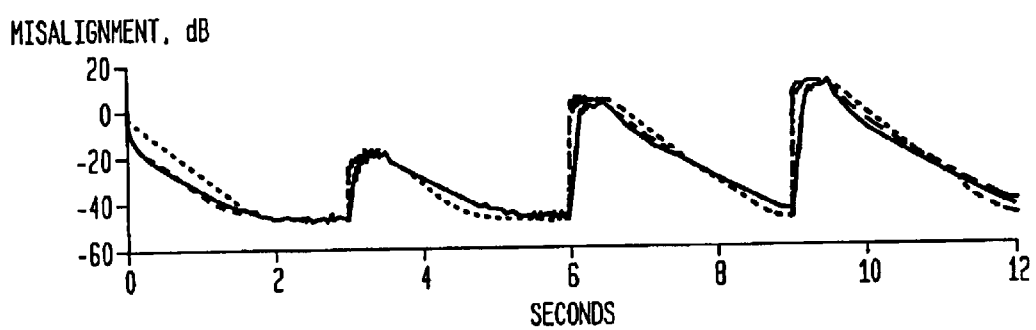
FIGS. 8(a) to 8(b) are a further group of graphs indicating performance results of the first preferred embodiment of the present invention; Performance during double-talk for parameter setting $\lambda=0.995$, $k_0=1.5$. Far- and near end ratio: 30 dB (3–3.5 s), (6–6.5s), 0.dB (9–9.5 s). (a) Misalignment without double-talk detector. (b) misalignment with double-talk detector. Solid line: R-PNLMS++, Dashed line: PNLMS++, Dotted line: NLMS. The small vertical bars indicate when double-talk is declared.
Figure 8B:
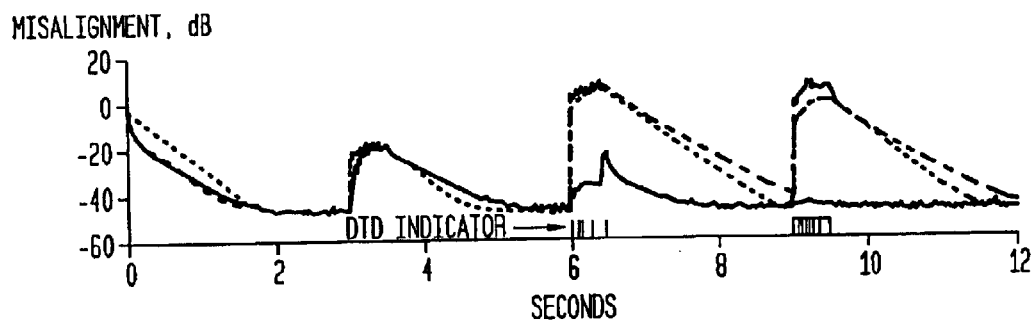

Results for the parameter setting $\lambda$=0.997 and $k_0$=1.5 are presented in FIG. 8. In this case the R-PNLMS++ is less robust as clearly seen at 6 s, in FIG. 8b. Divergence due to double-talk detection errors is larger than in the previous case. However, when the DTD 30 makes fewer mistakes, the divergence of the R-PNLMS++ is insignificant as seen between 9–9.5 s.

Figure 9A:
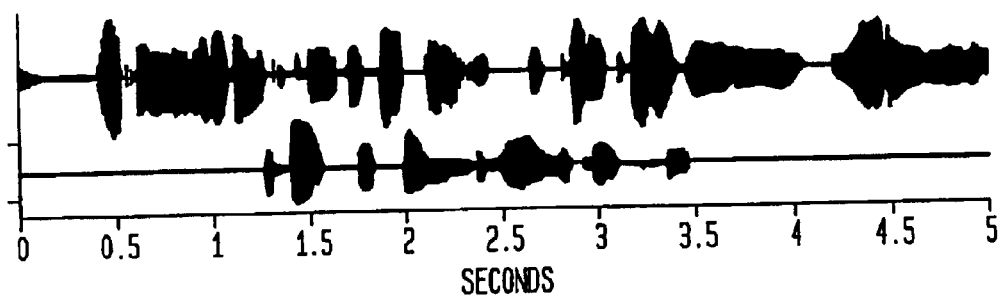
FIGS. 9(a) to 9(c) are a further group of graphs indicating performance results of the first preferred embodiment of the present invention; Double-talk, speech signal. (Far- and near-end signals. Average far- to near-end ratio: 6 dB (1.125–3.125 s), (b) Misalignment, $\lambda=0.997$, $k_0=1.1$. (c) Misalignment, $\lambda=0.995$, $k_0=1.5$. Solid line: R-PNLMS++, Dashed line: PNLMS++, Dotted line: NLMS.
Figure 9B:
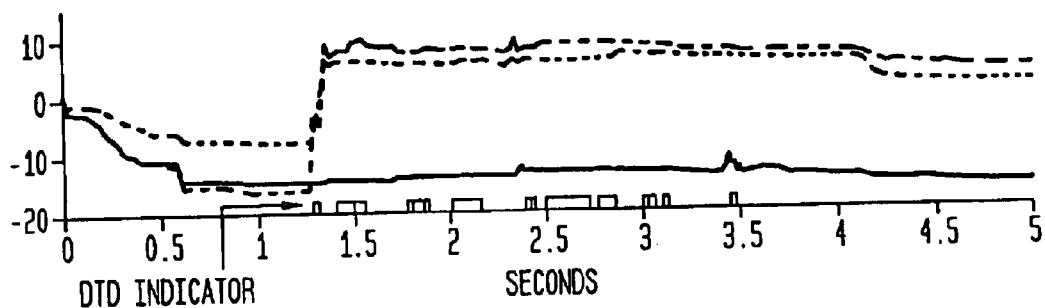
Figure 9C:
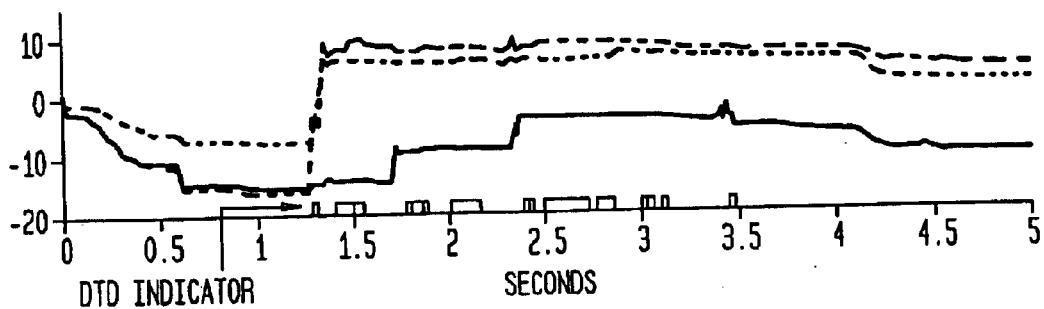
Figure 10A:
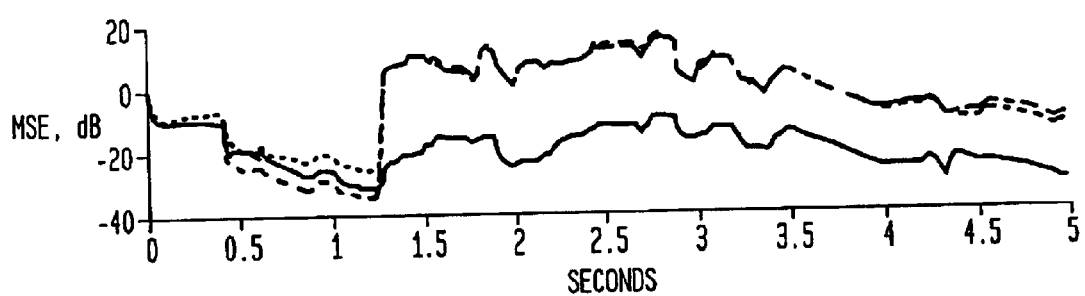
FIGS. 10(a) to 10(b) are a further group of graphs indicating performance results of the first preferred embodiment of the present invention; Double-talk, speech signal as in FIG. 6a. (a) shows MSE when $\lambda$=0.997, $k_0$=1.1. (b) shows MSE when $\lambda$=0.995, $k_0$=1.5. Solid line: R-PNLMS++, Dashed line: PNLMS++, Dotted line: NLMS.
Figure 10B:
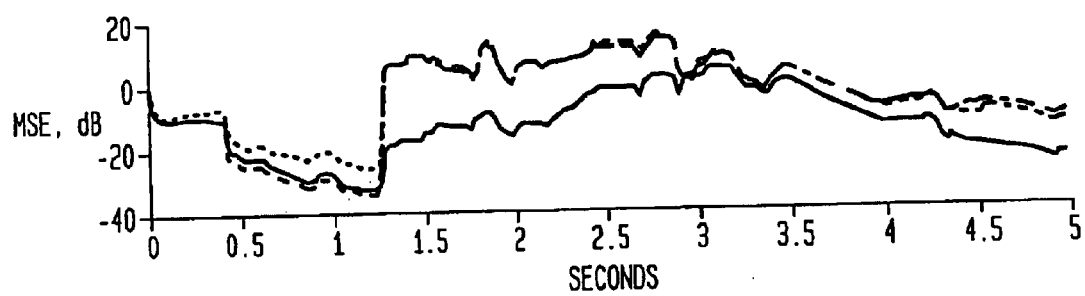

An example of the performance during double-talk when speech is used is shown in FIGS. 9 and 10. The far-end speaker is female and the near-end speaker is male, and the average far- to hear-end ratio is 6 dB. R-PNLMS++ performs considerably better during double-talk. For the second choice of parameters, (0.995, 1.5), a large number of DTD misses eventually affect the hybrid estimate. Observe that the misalignment does not decrease immediately after double-talk stops while the mean square error does. This is because some modes of the adaptive filter are poorly excitated by the far-end speech at 3.5 s.

(ii) Convergence After Abrupt Hybrid Change

Three cases of hybrid changes are tested,

A. $h_l \rightarrow -h_{l-200}$ at 3 s, (Practical case).

B. $-h_{l-200} \rightarrow -h_{l-200}$ at 6 s ("Best" case for PNLMS++).

C. $h_{l-200} \rightarrow -h_{l-200}$, l=0 . . . 39, $-h_{l-200}$ l=40 . . . 311 at 9 s, ("Worst" PNLMS++).

Figure 11A:
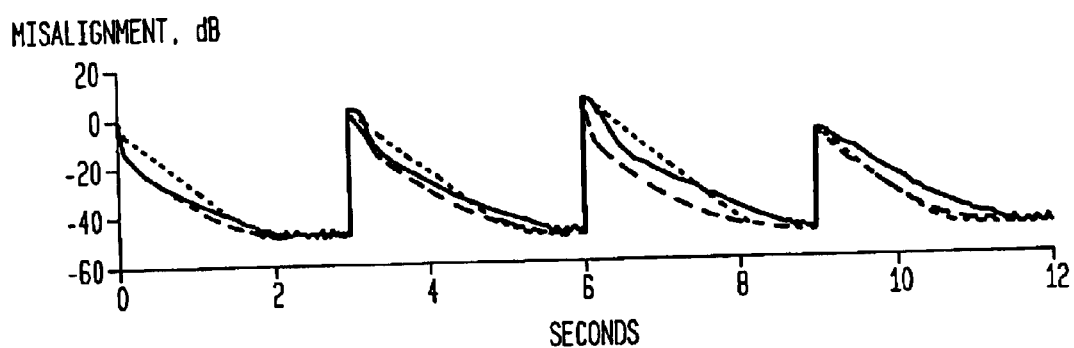
FIGS. 11(a) to 11(b) is a further group of graphs indicating performance results of the first preferred embodiment of the present invention; Reconvergence after abrupt hybrid changes. Case A at 3 s, Case B at 6 s and Case C at 9 s (See Section 4.2.2 for a definition the three conditions). (a) $\lambda$=0.997, $k_0$=1.1 (b) $\lambda$=0.995, $k_0$=1.5. Solid line: R-PNLMS++, Dashed line: PNLMS++, Dotted line: NLMS.
Figure 11B:
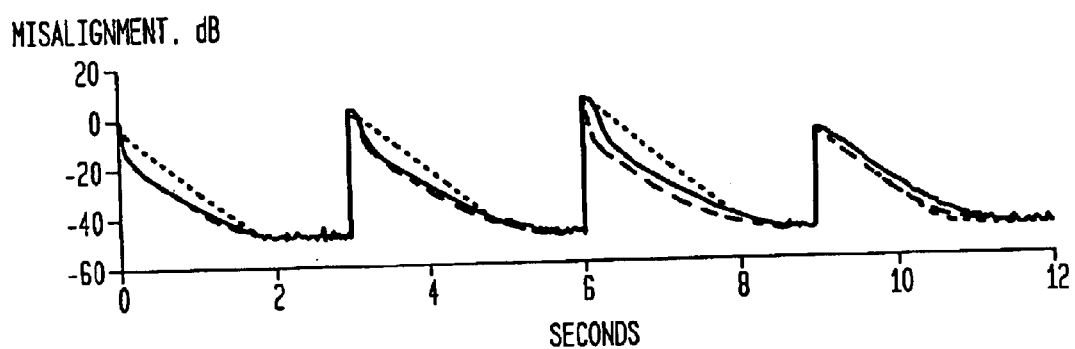
Figure 12A:
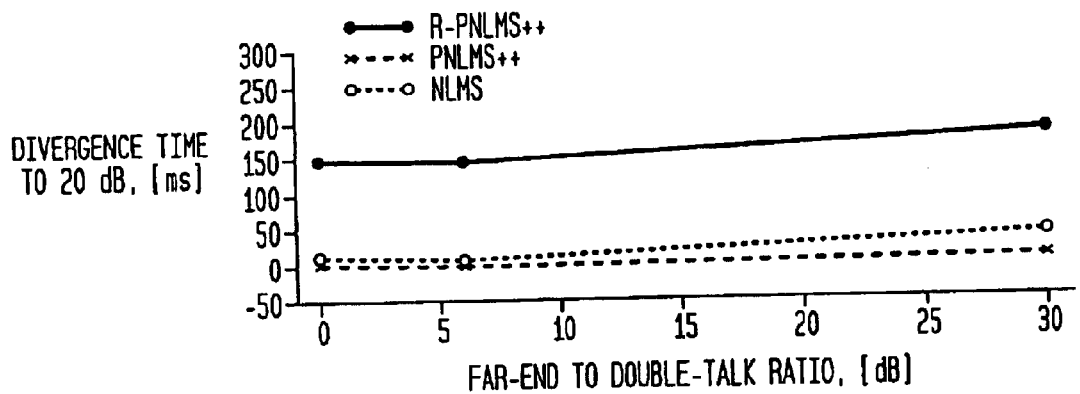
FIGS. 12(a) to 12(b) are graphical representations of divergence and convergence comparisons utilizing differing algorithms in a first embodiment of the present invention; Divergence (a) and convergence (b) time to 20 dB change of misalignment. $\lambda$=0.997, $k_0$=1.1. Solid line: R-PNLMS++, Dashed line: PNLMS++, Dotted line: NLMS.
Figure 12B:
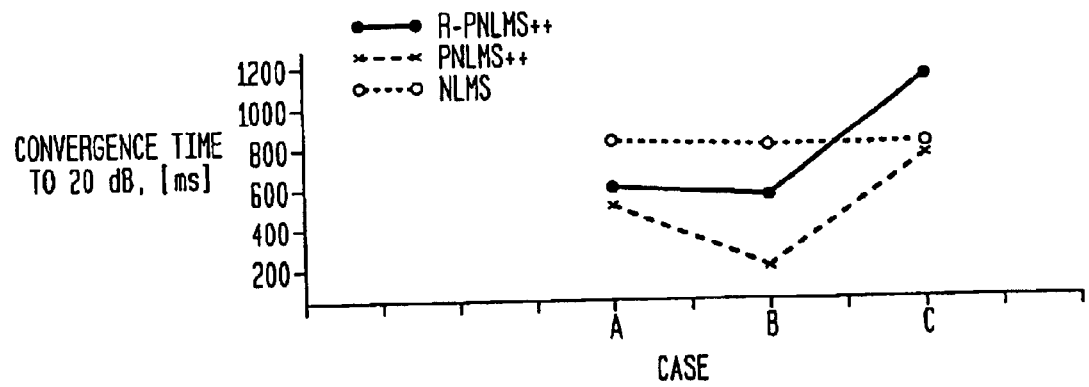
Figure 13A:
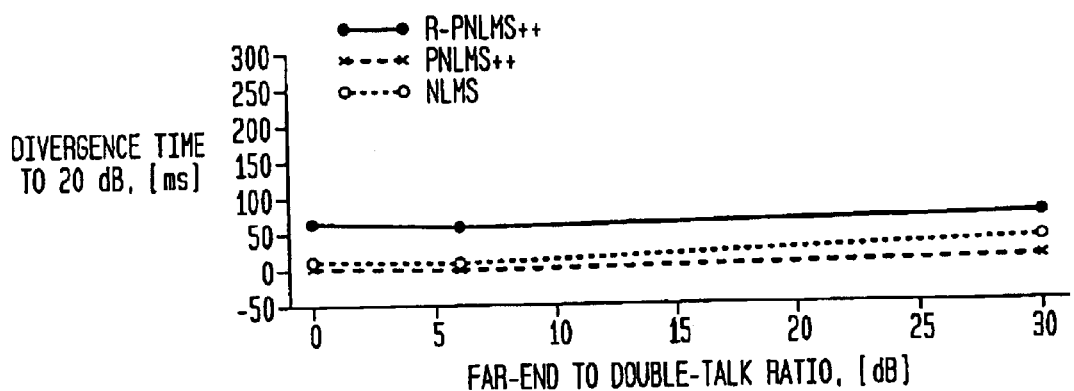
FIGS. 13(a) to 13(b) are further graphical representations of divergence and convergence comparisons utilizing differing algorithms in a first embodiment of the present invention; Divergence (a) and convergence (b) time to 20 dB change of misalignment. $\lambda$=0.995, $k_0$=1.5. Solid line: R-PNLMS++, Dashed line: PNLMS++, Dotted line: NLMS.
Figure 13B:
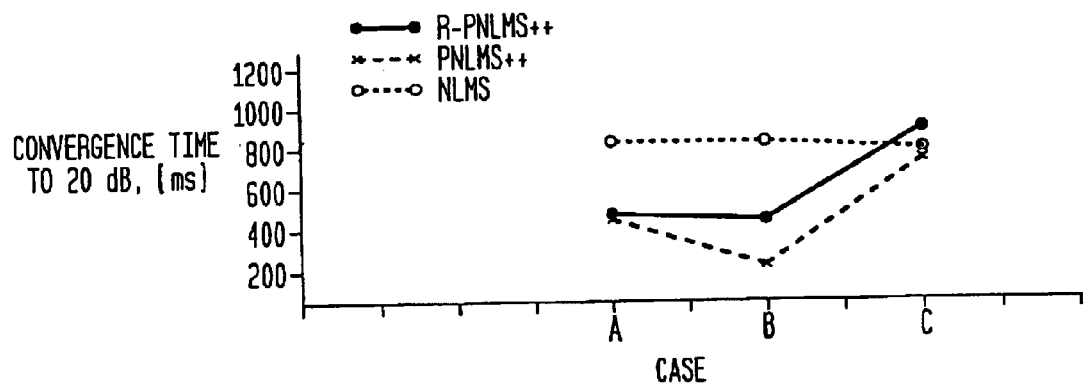

The price paid for robustness against double-talk is slower reconvergence after abrupt hybrid changes, which can be seen in FIG. 11. The difference between PNLMS++ and R-PNLIMS++ can be made fairly small, FIG. 11b. R-PNLMS++ performs better than NLMS in cases A and B for both parameter setting but is somewhat slower for case C. The performance loss for re-convergence of the robust algorithm is minor. FIGS. 12 and 13 summarize the divergence and convergence time of the algorithms where divergence/convergence time is defined as the time it takes for the algorithm to increase/decrease misalignment by 20 dB.

(iii) Tracking a Slowly Changing Hybrid $h_l \to -h_{l-10}$ gradually between 3–4 s.

Figure 14A:
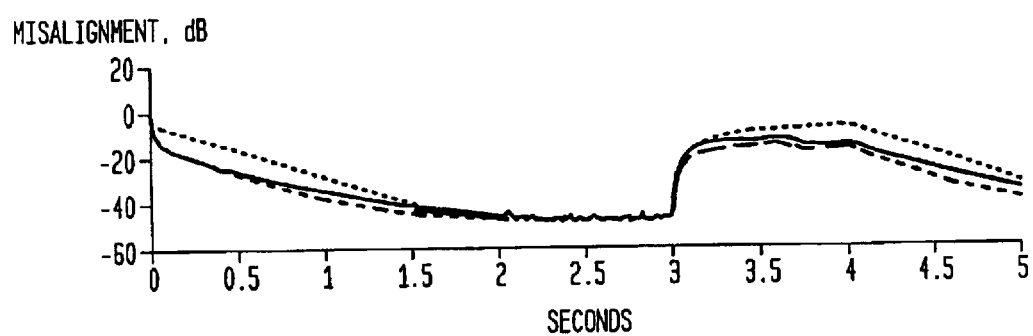
FIGS. 14(a) to 14(b) are a further group of graphs indicating performance results of the first preferred embodiment of the present invention; Misalignment when tracking a nonstationary hybrid, 3–4 s. (a) $\lambda$=0.997, $k_0$1.1 (b) $k_0$=1.5. Solid line: R-PNLMS++, Dashed line: PNLMS++. Dotted line: NLMS.
Figure 14B:
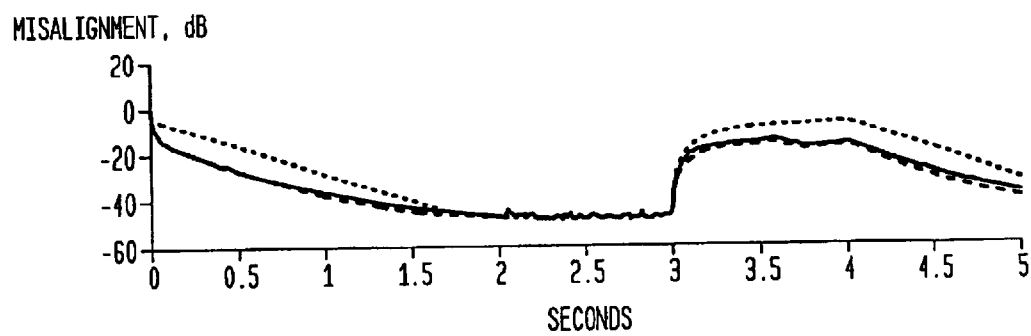
Figure 15A:
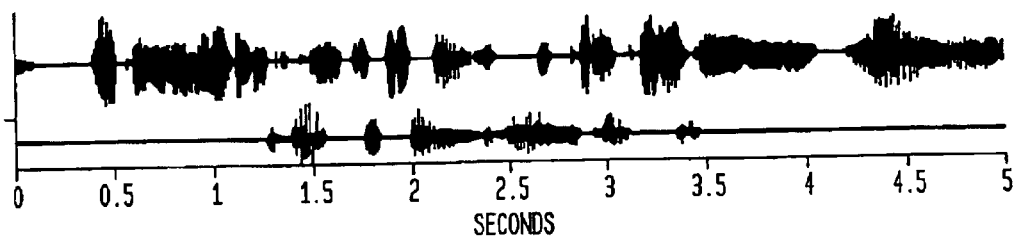
FIGS. 15(a) to 15(d) are a group of graphs indicating performance results of a second embodiment of the present invention; Misalignment during double-talk starting at 1.25 seconds. Far- to near-end ratio: 6 dB. (a) Far (upper) and near-end (lower) signals. (b) Solid line: R-PNLMS++, Dotted line: PNLMS++. (c) Solid line: R-APA, Dotted line: APA. (d) Solid line: R-PAPA, Dotted line: PAPA.
Figure 15B:
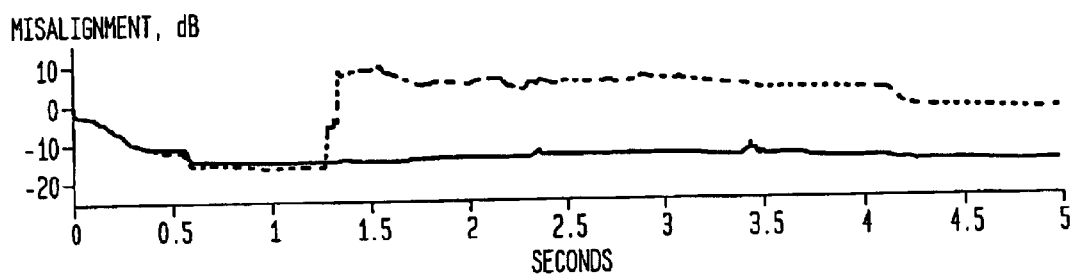
Figure 15C:
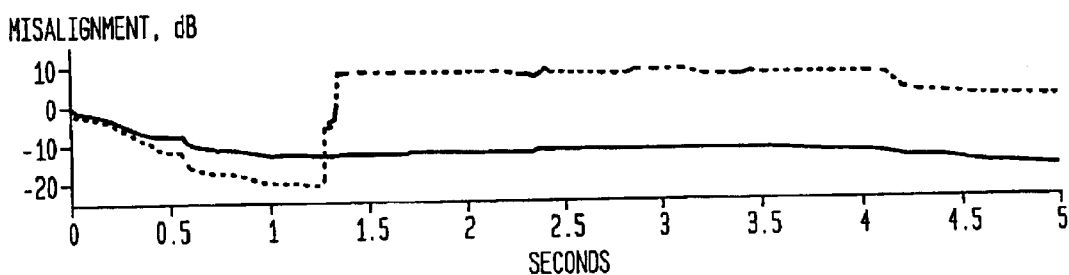
Figure 15D:
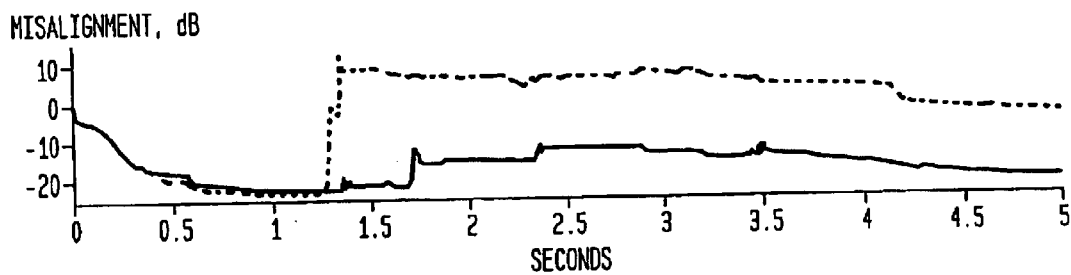
Figure 16A:
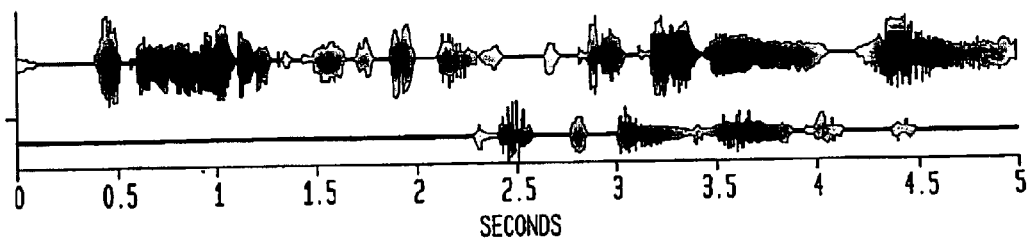
FIGS. 16(a) to 16(d) are a group of graphs indicating performance results of a second embodiment of the present invention; Misalignment during double-talk starting at 2.25 seconds. Far-to-near-end ratio: 6 dB (a) Far (upper) and near-end (lower) signals. (b) Solid line: R-PNLMS++, Dotted line: PNLMS++. (c) Solid line: R-APA, Dotted line: APA. (d) Solid line: R-PAPA, Dotted line: PAPA.
Figure 16B:
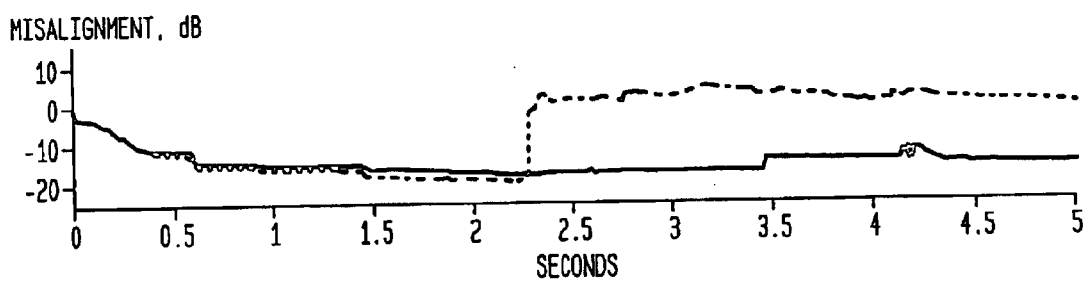
Figure 16C:
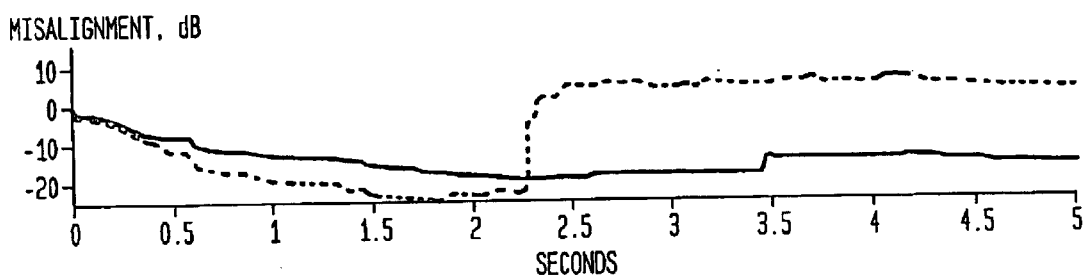
Figure 16D:
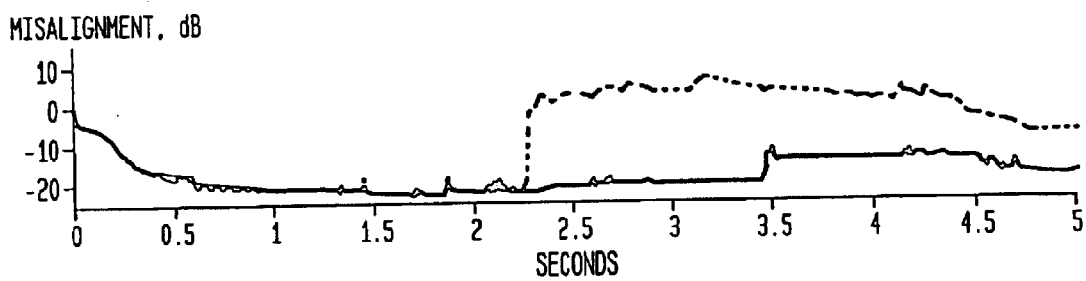
Figure 17A:
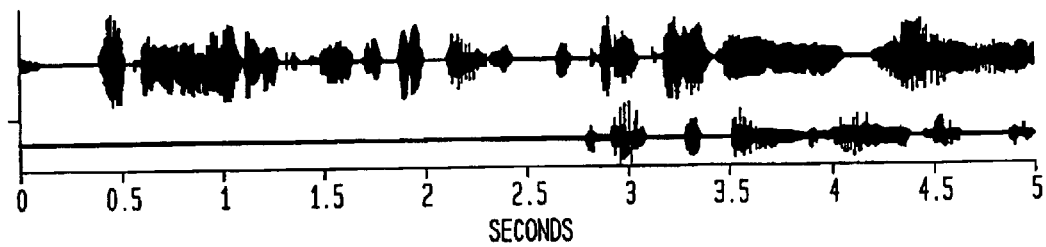
FIGS. 17(a) to 17(d) are a group of graphs indicating performance results of a second embodiment of the present invention; Misalignment during double-talk starting at 2.75 seconds. Far- to near-end ratio: 6 dB. (a) Far (upper) and near-end (lower) signals. (b) Solid line: R-PNLMS++, Dotted line: PNLMS++. (c) Solid line: R-APA, Dotted line: APA. (d) Solid line: R-PAPA, Dotted line: PAPA.
Figure 17B:
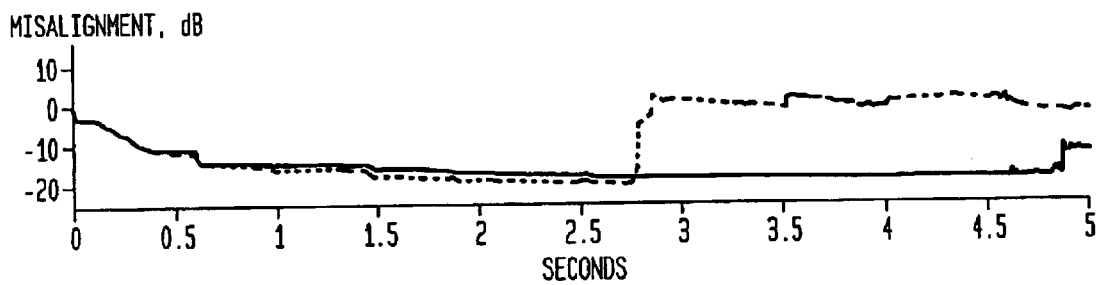
Figure 17C:
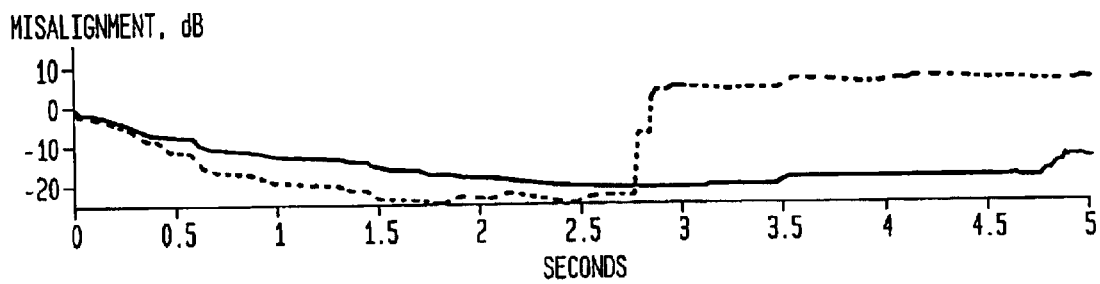
Figure 17D:
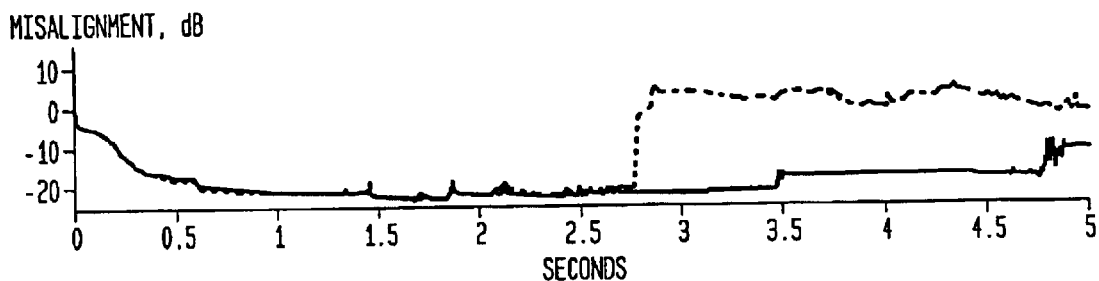
Figure 18A:
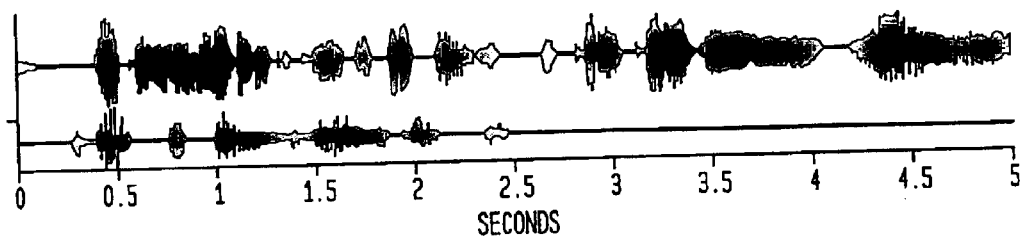
FIGS. 18(a) to 18(d) are a group of graphs indicating performance results of a second embodiment of the present invention; Misalignment during double-talk starting at 0.25 seconds. Far- to near-end ratio: 6 dB. (a) Far (upper) and near-end (lower) signals. (b) Solid line: R-PNLMS++, Dotted line: PNLMS++. (c) Solid line: R-APA, Dotted line: APA. (d) Solid line: R-PAPA, Dotted line: PAPA.
Figure 18B:
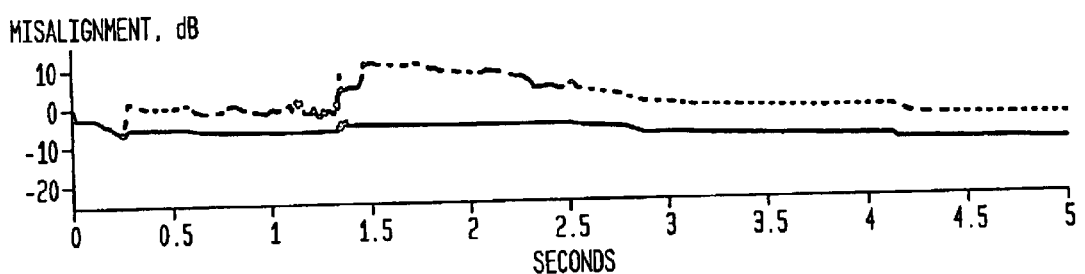
Figure 18C:
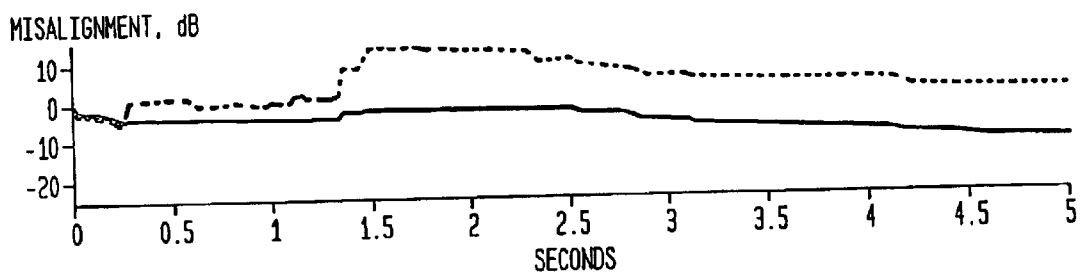
Figure 18D:
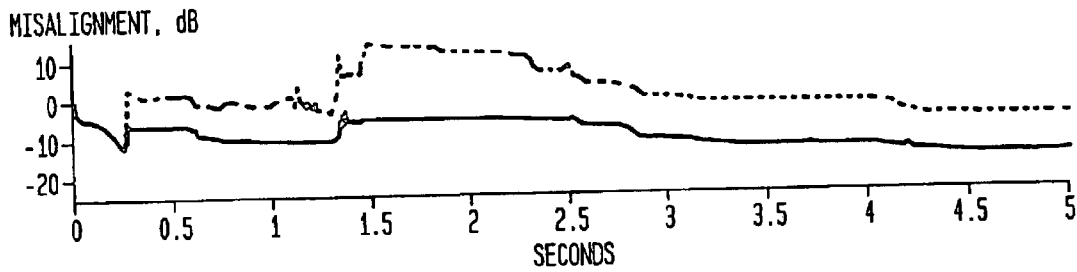
Figure 19A:
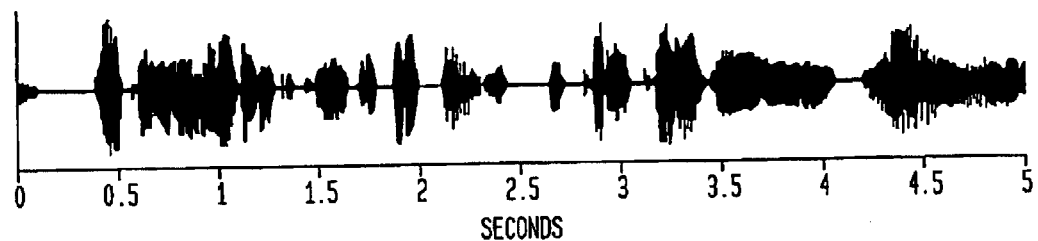
FIGS. 19(a) to 19(d) are a group of graphs indicating performance results of a second embodiment of the present invention; Misalignment after abrupt hybrid change occurring at 1 second. (a) Far (upper) and near-end (lower) signals. (b) Solid line: R-PNLMS++, Dotted line: PNLMS++. (c) Solid line: R-APA, Dotted line: APA. (d) Solid line: R-PAPA, Dotted line: PAPA.
Figure 19B:
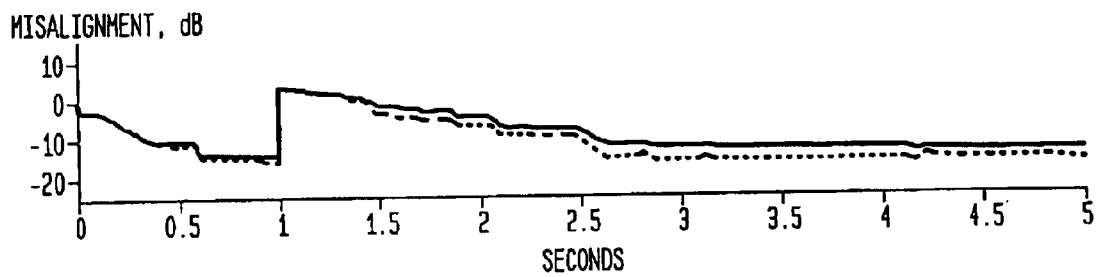
Figure 19C:
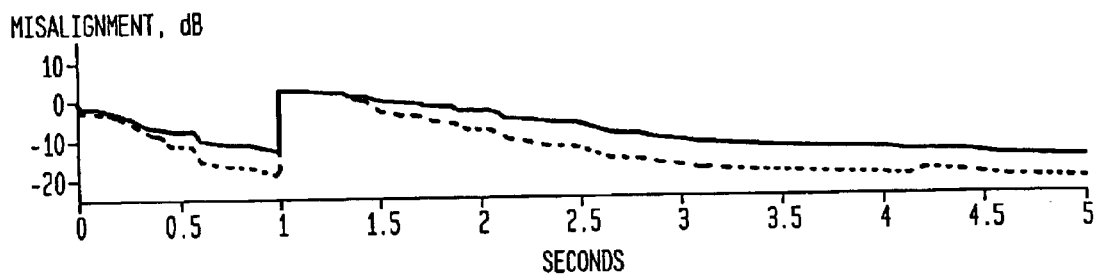
Figure 19D:
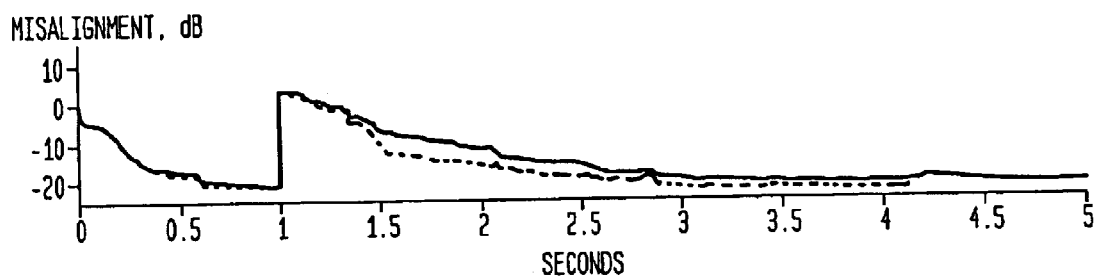
Figure 20A:
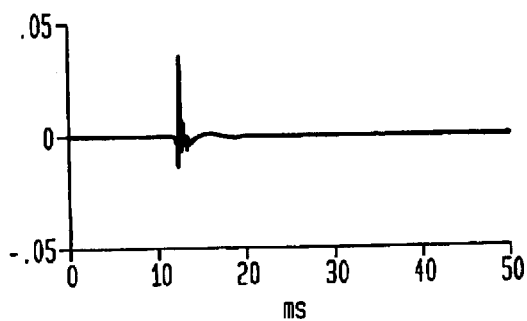
FIGS. 20(a) to 20(f) are a group of curves depicting the impulse response and corresponding magnitude of frequency responses for three alternate test hybrid configurations used in performing tests on the second embodiment of the present invention; The three hybrids are Test 3a and Test 3b. (a, c, e) Impulse responses. (b, d, f) Corresponding magnitudes of the frequency responses.
Figure 20B:
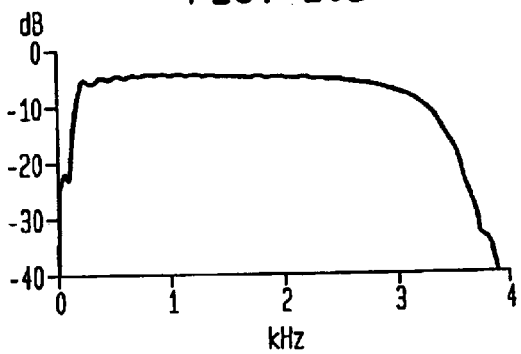
Figure 20C:
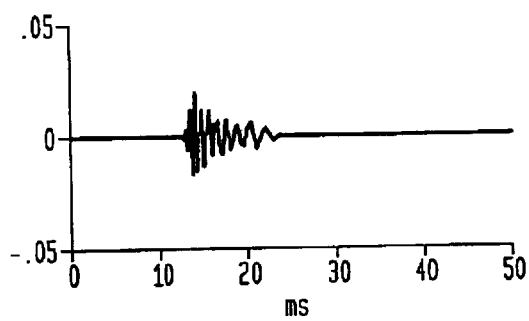
Figure 20D:
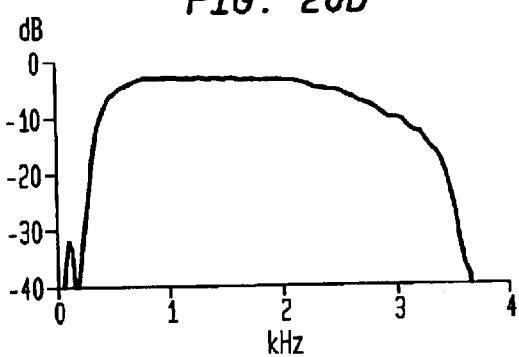
Figure 20E:
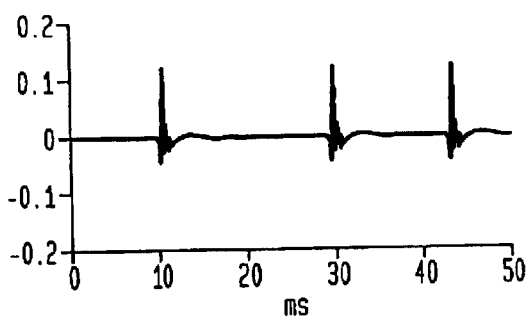
Figure 20F:
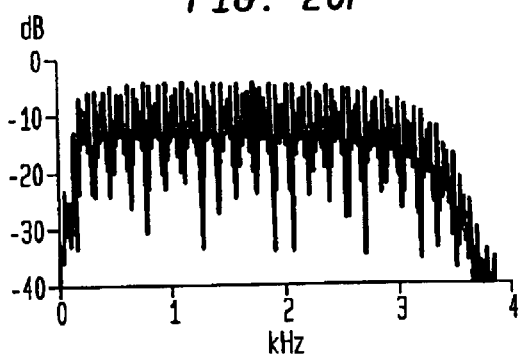

Results from tracking a continuously changing hybrid are presented in FIG. 14. The hybrid changes slowly over a period of 1 s. R-PNLMS++ and PNLMS++ track equally well while NLMS performs poorer. The impact of the non-linearity in this test is insignificant.

R-PAPA

As mentioned above, utilization of PLNMS in coefficient vector update device 40 does not take into account the fact that the speech signal is a correlated signal. Taking this into account can further increase convergence, specifically by utilizing APA and making it robust.

Considering all of the above, a robust version of PAPA (and hence of APA) is obtained straightforwardly, as set forth below:

$$\phi(|e_n|) = \min\{|e_n|, s_n k_0\}, \quad (57)$$

$$h_{n+1} = h_n + \mu G_n X_n R_{xx}^{-1}(n)[\phi(|e_n|) \odot \text{sign}(e_n)], \quad (58)$$

$$s_{n+1} = \lambda_{sn} + \frac{(1-\lambda)}{\beta}\varphi(|e1,n|). \quad (59)$$

In (58) $\odot$ denotes elementwise multiplications.

Additionally, some of the computational procedures of the Fast Affine Projection (FAP) algorithm, can be incorporated in order to reduce the computational complexity of APA and PAPA. The elements of the correlation matrix can be updated recursively. Thus, if we define:

$$r_{11,0} = r_{11,-1} = \delta \quad (60)$$

$$r_{12,0} = 0, \quad (61)$$

(62)

then $$r_{22,n} = r_{11,n-1} \quad (63)$$

$$r_{11,n} = r_{11,n-1} + x_n^2 - x_{n-L}^2 \quad (64)$$

$$r_{11,n} = r_{12,n-1} + x_n x_{n-1} - x_{n-L} x_{n-L-1}. \quad (65)$$

The calculation of the error vector in APA (11) can be approximated as follows, $$e_n = d_n - x_n^T h_{n-1} \quad (66)$$

$$e_n = [e_n(1-\mu)e_{1,n-1}]^T, \quad (67)$$

which reduces the calculations needed by L−1 multiplies. The complexity of the APA algorithm can be reduced further by introducing an alternative coefficient vector, $\hat{h}_n$ mentioned in eq. (9). Unfortunately, this cannot be done in PAPA, because invariance of the product of the step-size matrix and the excitation vector is destroyed since $G_n$ varies from one iteration to the next. Shown (A1 through A22) below are exemplary fast versions of the robust APA and proportional APA. Adaptation is preferably inhibited by double-talk detector 30 which also controls the updating of the scale factor $s_n$ utilized by adaptive scaled non-linearity device 50. In the exemplary simulations discussed further herein, a Geigel DTD has been used which is given by, if$|y_n| \geq \vartheta \max\{|x_n|, |x_{n-1}|, \ldots, |x_{n-L+1}|\}$ or $\text{Count}_{hold} > 0$ -continued $\mu = 0;$ if $(\text{Count}_{hold} \leq 0)$ $\text{Count}_{hold} = T_{hold}$ $\text{Count}_{scale} = T_{hold,scale};$ else $\text{Count}_{hold} = \text{Count}_{hold} - 1$ $\text{Count}_{scale} = \text{Count}_{scale} - 1;$ end else $\mu = 0.2;$ if $\text{Count}_{scale} > 0$ $\text{Count}_{scale} = \text{Count} - 1;$ end end $T_{hold}$ is a hangover time for adaptation and Thold,scale is the hangover time for the scale factor. The director threshold, $\vartheta=0.5$, if we assume 6 dB of hybrid attenuation and $\vartheta \approx 0.71$ for a 3 dB assumption.

*Robust APA*

$$E_n = [E_{1,n} E_{2,n}]^T \quad (A1)$$

$$E_0 = 0 \quad (A2)$$

$$r_{22,n} = r_{11,n-1} \quad (A3)$$

$$r_{11,n} = r_{11,n-1} + x_n^2 - x_{n-L}^2 \quad (A4)$$

$$r_{12,n} = r_{12,n-1} + x_n x_{n-1} - x_{n-L} x_{n-L-1} \quad (A5)$$

$$\hat{e}_n = dn - x_n^T \hat{h}_{n-1} \quad (A6)$$

$$e_n = \hat{e} - \mu r_{12,n} E_{l,n} \quad (A7)$$

$$\psi(|e_n|) = \min\{|e_n|, k_0 s_n\} \quad (A8)$$

$$e_n = [sign(e_n)\psi(|e_n|)] (1-\mu)e_{1,n-1}]T \quad (A9)$$

$$E_n = [E_{1,n}^0] + R_{xx,n}^1 e_n \quad (A10)$$

$$\hat{h}_n = \hat{h}_{n-1} + \mu x_{n-1} E_{2,n} \quad (A11)$$

if$(\text{Count}_{scale} \leq 0)$ $$s_{n+1} = \lambda sn + \frac{(1-\lambda)}{\beta}\psi(|e_n|) \quad (A12)$$

else $$s_{n+1} = \lambda sn + (1-\lambda)s \min \quad (A13)$$

end

*Robust PAPA*

$$r_{22,n} = r_{11,n-1} \quad (A14)$$

$$r_{11,n} = r_{11,n-1} + x_n^2 - x_{n-L}^2 \quad (A15)$$

$$r_{12,n} = r_{12,n-1} + x_n x_{n-1} - x_{n-L} x_{n-L-1} \quad (A16)$$

-continued $$e_n = d_n - x_n^T h_{n-1} \quad (A17)$$

$$\psi(|e_n|) = \min\{|e_n|, s_n k_o\} \quad (A18)$$

$$e_n = [sign(e_n)\psi(|e_n|)(1-\mu)e_{l,n-1}]^T \quad (A19)$$

$$h_n = h_{n-1} x_n^2 + \mu G_n X_n R_{xx,n}^{-1} e_n \quad (A20)$$

if $(Count_{scale} \leq 0)$ $$s_{n+1} = \lambda s_n + \frac{(1-\lambda)}{\beta}\psi(|e_n|) \quad (A21)$$

else $$s_{n+1} = \lambda s_n + (1-\lambda)s_{min} \quad (A22)$$

end where $s_{min}$ is a preset constant. $s_{min}$ is the assumed minimum background power level of the noise. Inversion of the correlation matrix $R_{xx,n}$ is preferably made with Gaussian elimination. Using this technique of the robust APA requires 2L+13 multiplies and 3 divisions, and robust PAPA requires 4L+12 multiplies and 3 divisions. The individual step-size matrix $G_n$ is given by (22) to (25) above.

R-PAPA SIMULATIONS

In the following simulations we compare the performance of six algorithms, R-PNLMS++, PNLMS++, R-APA, APA, R-PAPA and PAPA.

The purpose of these simulations is to show the excellent performance of the robust algorithms during double-talk and the high convergence rate of the robust PAPA and PAPA algorithms when speech is used as excitation signal. With a projection order of 2, an input signal having the properties of an AR{1} process can be perfectly whitened and maximum improvement of the convergence rate is achieved. Speech, however, is not an AR{1} process but can be fairly well modeled by an 8th order AR process. An order of 2 is preferably chosen as a compromise between complexity and performance. The parameter settings chosen for the following simulations are:

$\rho$=5/L has been recommended for PNLMS. However, for PNLMS ++ a smaller value can be used resulting in lower sensitivity to different impulse responses. $\mu$=0.2, L=512 (64 ms), $\delta$=2·10$^5$ (R-PNLMS++ and PNLMS++), $\delta$=1 10$^6$ (R-APA, APA, R-PAPA and PAPA), $\delta_p$=0.01, $\rho$=0.001[1]

$\delta_x$=1900, SNR=39 dB (echo-to-noise ratio).

Average far-end to double-talk ratio is 6 dB.

Hybrid attenuation: 20 dB.

Geigel detector assumes 6 dB attenuation.

Parameters for the robust algorithm are, (A, k$_0$)=(0.997, 1.1). This choice results in 0-,Z~0.60665. $s_{min}$=2, $s_0$=1000.

h$_0$=0

Impulse response and corresponding magnitude function of the test hybrid is shown in FIG. 6

FIGS. 15–18 show far-end signal, double-talk and the misalignment of the six algorithms. The sequence of double-talk starts at different times in the four simulations thus showing the reliable performance of the robust algorithm for different double-talk situations. The principle of robustness works at all stages of convergence of the algorithms. Thus, as seen in FIG. 18, the algorithms (R-PNLMS++, R-APA, R-PAPA) resist divergence during double-talk even though they have not yet fully converged. This is due to the adaptive scale factor. Initial convergence rates of the PAPA and R-PAPA are superior to the other algorithms. FIG. 19 shows the behavior after an abrupt system change where the impulse response is shifted 200 samples at 1 second. It is can thus be seen that PAPA and R-PAPA are the fastest converging algorithms. Note that the robust PAPA converges even faster than PNLMS++.

R-PAPA EXPERIMENTS—Composite Source Signal as Excitation Signal

As is known, ITU-T G.168 recommends certain test procedures for evaluating the performance of echo cancelers. Test signals used are the so called Composite Source Signals (CSS) that have properties similar to those of speech with both voiced and unvoiced sequences as well as pauses. This section presents the results from two test situations evaluating the performance during double-talk, the so called Test 3A and Test 3B. In Test 3A the double-talk sequence is of low level, i.e. 15 dB, below the far-end signal. It is of course recognized that a Geigel DTD assuming 6 dB attenuation is not able to detect this "double-talk". However, in some cases where the instantaneous far-end level is low and the near-end level is high, the DTD may inhibit adaptation. Test 3B evaluates the performance of the echo canceller 10 for a high level double-talk sequence. The double-talk level in this case is about the same as that of the far-end signal, thus a fixed threshold Geigel DTD assuming 6 dB attenuation is able to detect this double-talk. False alarms and failures to detect double-talk are influenced by the chosen threshold in the DTD and the attenuation in the hybrid. Three hybrid attenuations are therefore evaluated. The parameter and initial value settings for both conducted tests are $\rho$=0.2, L=512 (64 ms), $\delta$=2–10$^5$ (R-PNLMS++ and PNLMS++), $\delta$=1–10$^8$ (R-APA, APA, R-PAPA and PAPA), $\delta_p$=0.01, $\rho$=0.001

Parameters for the robust algorithm are, ($\lambda$, k$_0$)=(0.9975, 1.5). This choice results in $\beta$≈0.73927, $s_{min}$=10, $s_0$=1000.

$\delta_x$=1.3·10$^4$, SNR 37 dB (echo-to-PCM quantization noise ratio).

Hybrid attenuations: 6, 8, 11 dB.

Geigel detect or assumes 3 dB attenuation.

h$_o$=0.

Figure 21A:
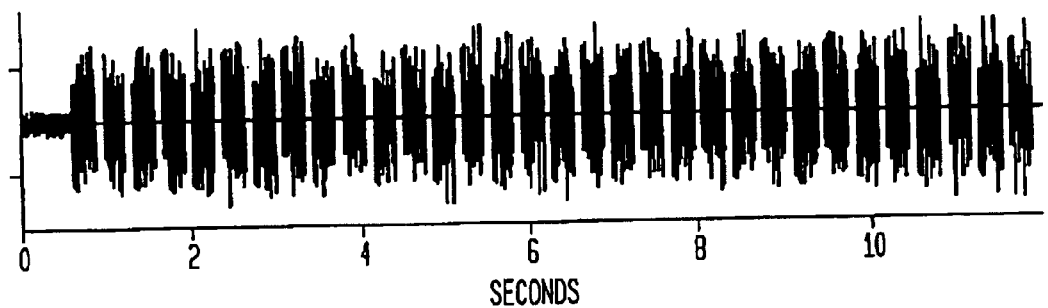
FIGS. 21(a) to 21(c) are a group of graphical representations of the signal utilized for a test 3A performed on a second embodiment of the present invention; Signal for Test 3a. (a) Far-end signal. (b) Echo and near-end signal. (c) Near-end signal.
Figure 21B:
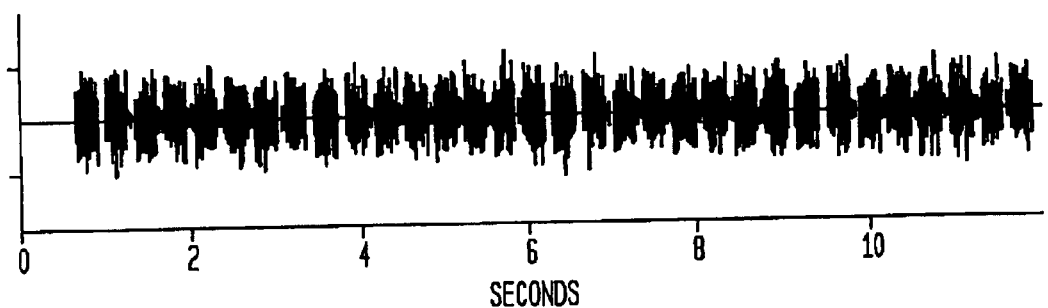
Figure 21C:
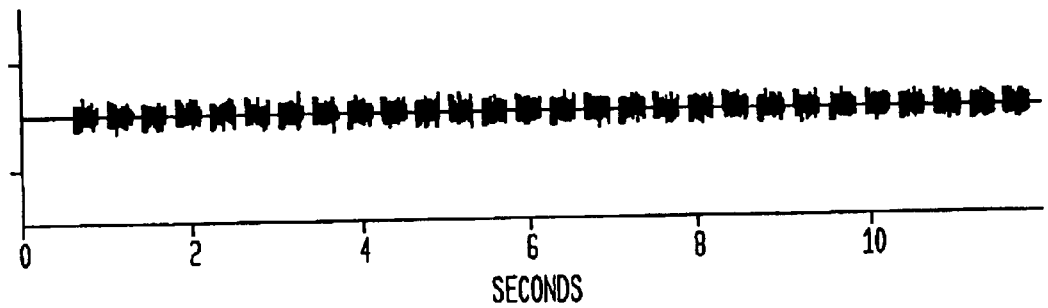
Figure 22A:
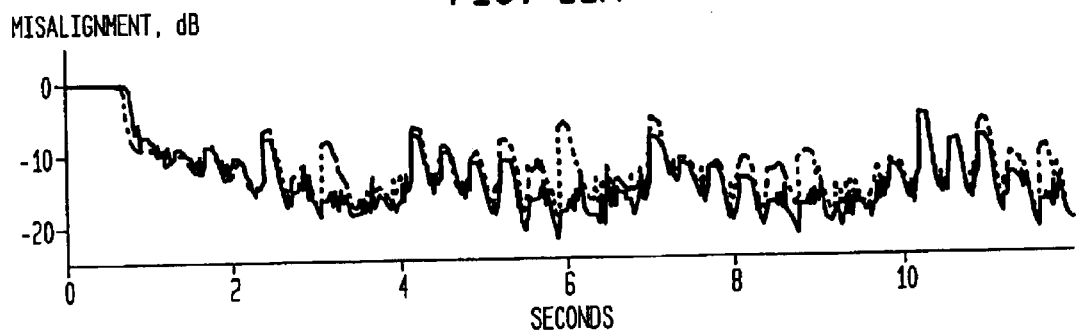
FIGS. 22(a) to 22(c) are a group of graphs indicating performance results of a first test performed on a second embodiment of the present invention; Misalignment Test 3a, hybrid in FIG. 9a (sparse) with 8 dB attenuation. (a) Solid line: Robust PNLMS++, dashed line: PNLMS++. (b) Solid line: Robust APA, dashed line: APA. (c) Solid line: Robust PAPA, dashed line: PAPA.
Figure 22B:
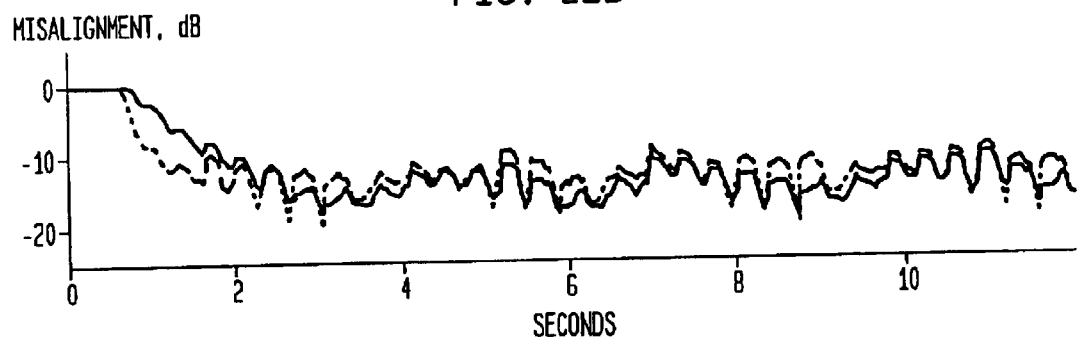
Figure 22C:
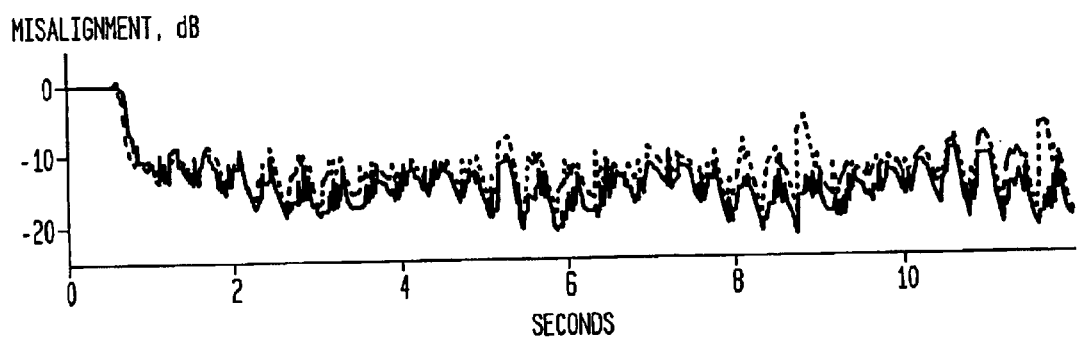
Figure 23A:
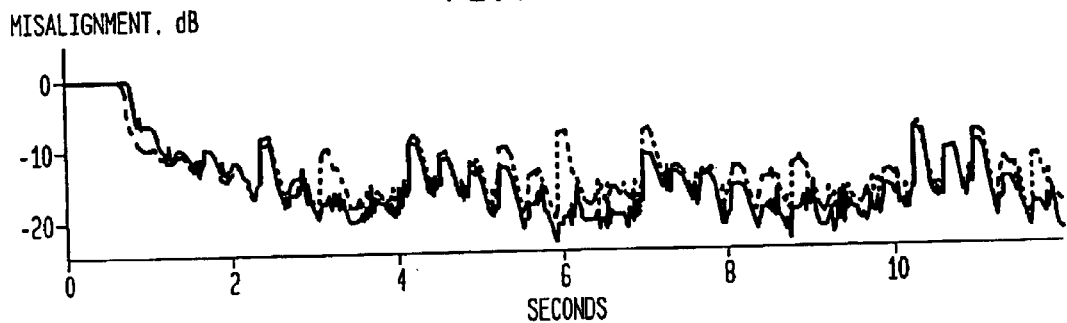
FIGS. 23(a) to 23(c) are a further group of graphs indicating performance results of a first test on a second embodiment of the present invention; Misalignment Test 3a, hybrid in FIG. 9a (sparse) with 6 dB attenuation. (a) Solid line: Robust PNLMS++, dashed line: PNLMS++. (b) Solid line: Robust APA, dashed line: APA. (c) Solid line: Robust PAPA, dashed line: PAPA.
Figure 23B:
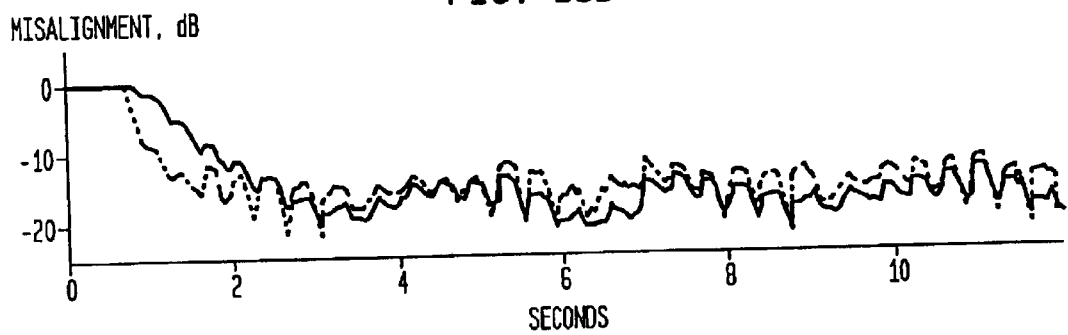
Figure 23C:
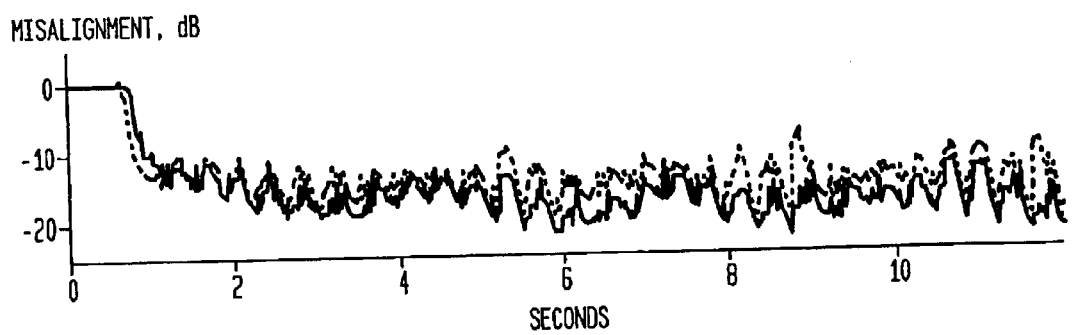
Figure 24A:
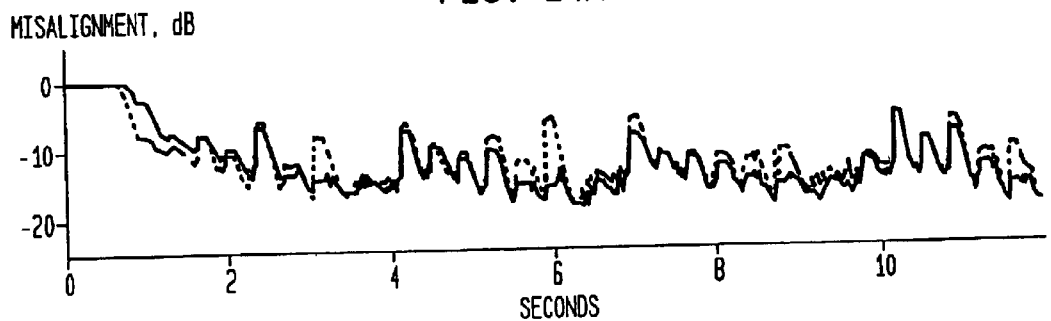
FIGS. 24(a) to 24(c) are a further group of graphs indicating performance results of a first test on a second embodiment of the present invention; Misalignment Test 3a, hybrid in FIG. 9c (dispersive) with 8 dB attenuation. (a) Solid line: Robust PNLMS++, dashed line: PNLMS++. (b) Solid line: Robust APA, dashed line: APA. (c) Solid line: Robust PAPA, dashed line: PAPA.
Figure 24B:
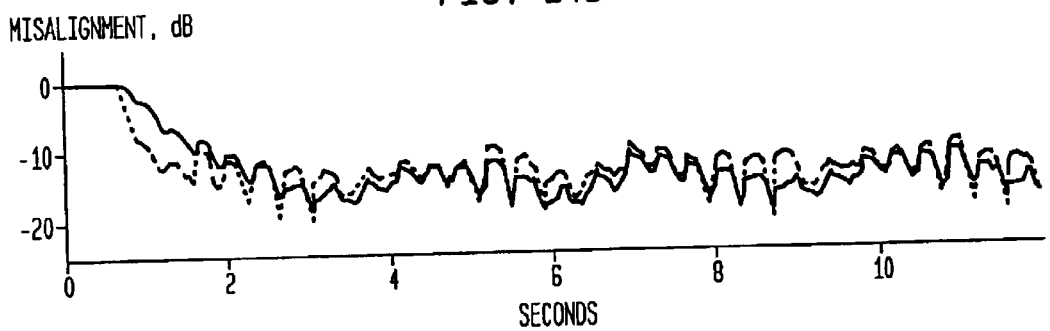
Figure 24C:
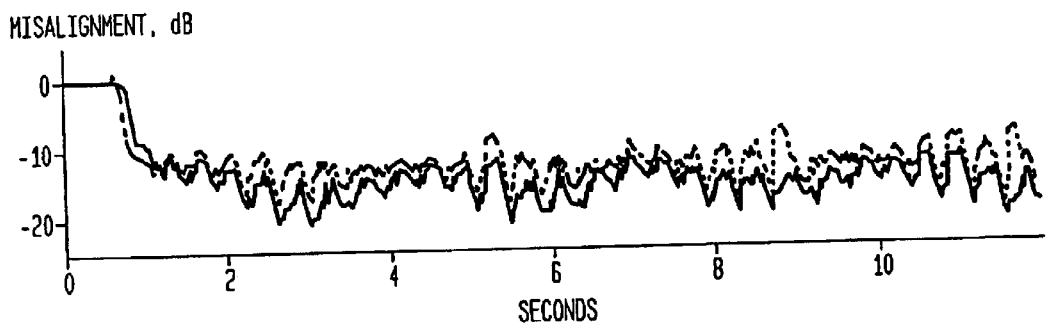
Figure 25A:
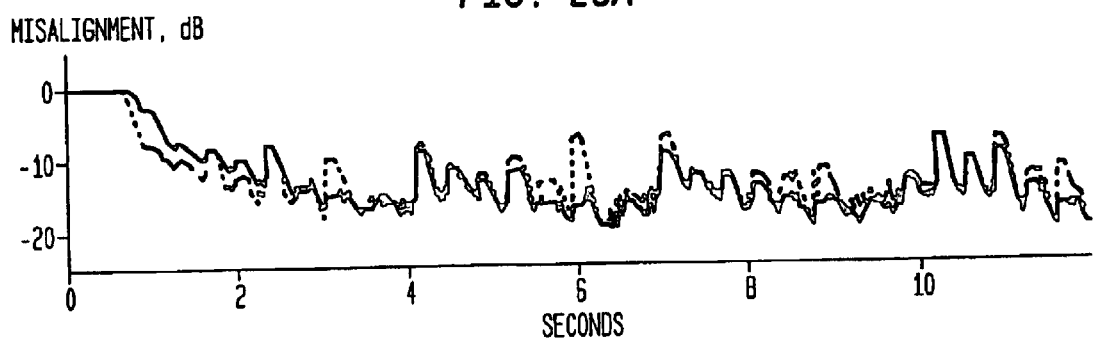
FIGS. 25(a) to 25(c) are a further group of graphs indicating performance results of a first test on a second embodiment of the present invention; Misalignment Test 3a, hybrid in FIG. 9c (dispersive) with 6 dB attenuation. (a) Solid line: Robust PNLMS++, dashed line: PNLMS++. (b) Solid line: Robust APA, dashed line: APA. (c) Solid line: Robust PAPA dashed line: PAPA.
Figure 25B:
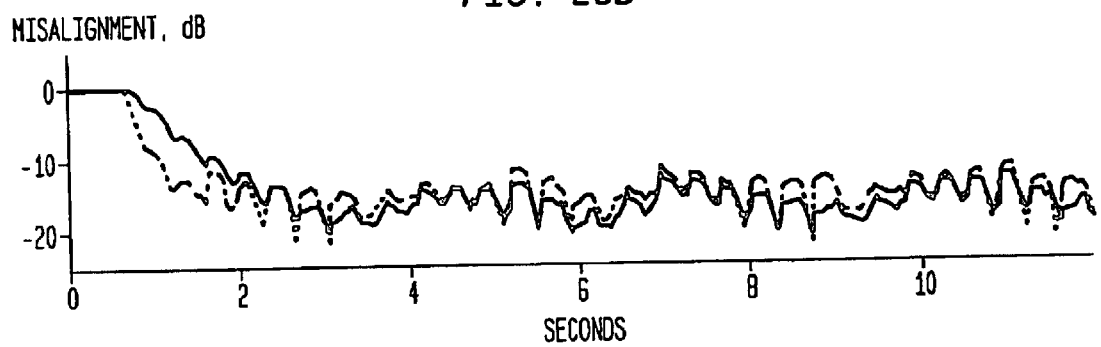
Figure 25C:
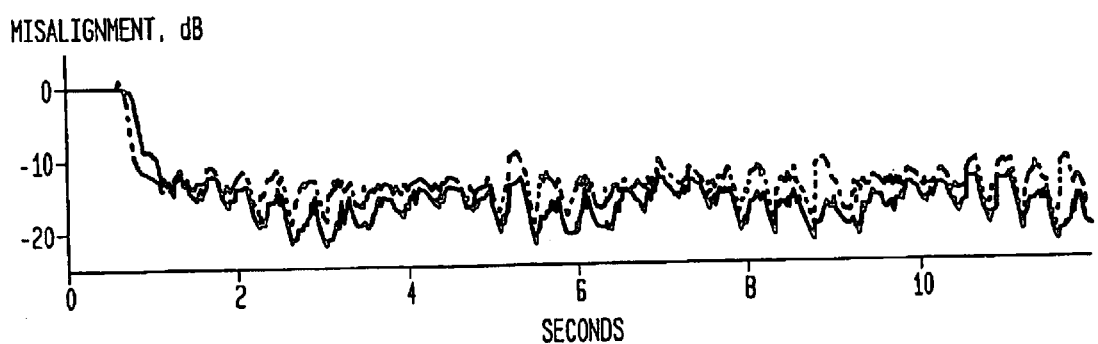
Figure 26A:
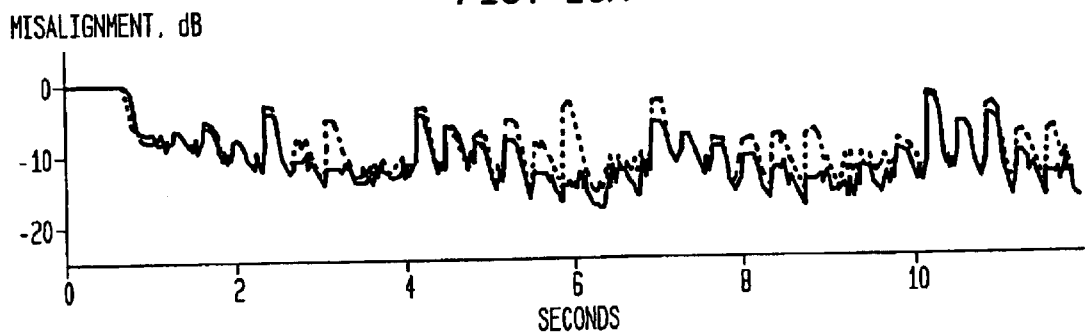
FIGS. 26(a) to 26(c) are a further group of graphs indicating performance results of a first test on a second embodiment of the present invention; Misalignment Test 3a, hybrid in FIG. 9e (three short reflections) with 11 dB attenuation. (a) Solid line: Robust PNLMS++, dashed line: PNLMS++. (In Solid line: Robust APA, dashed line: APA. (c) Solid line: Robust PAPA. dashed line: PAPA.
Figure 26B:
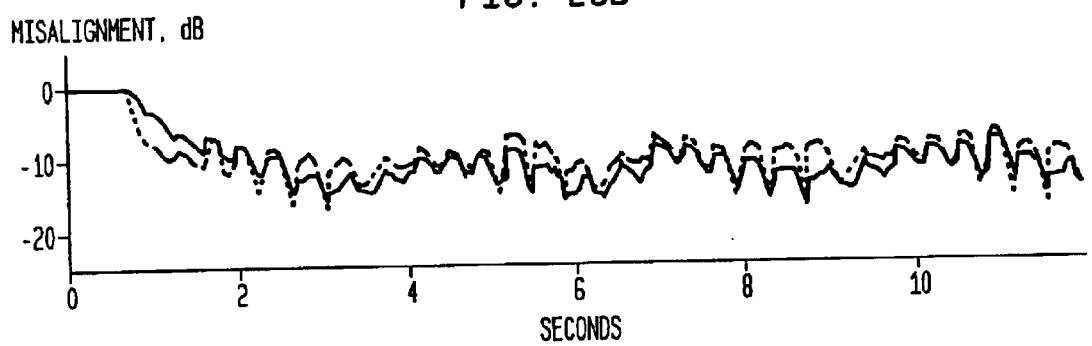
Figure 26C:
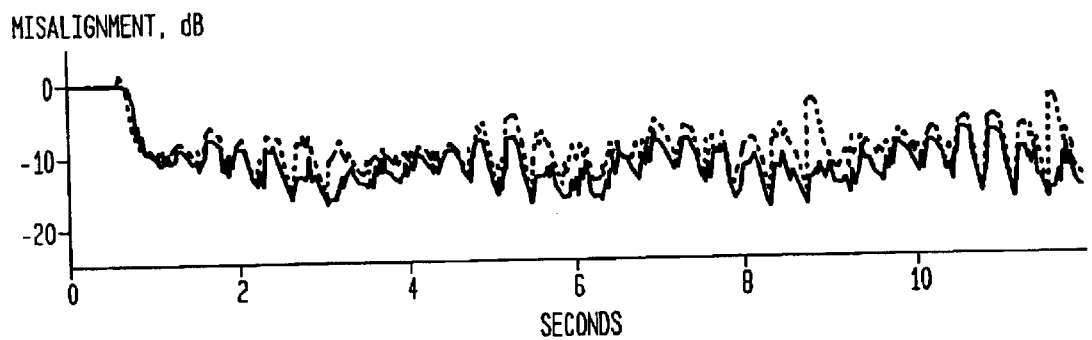
Figure 27A:
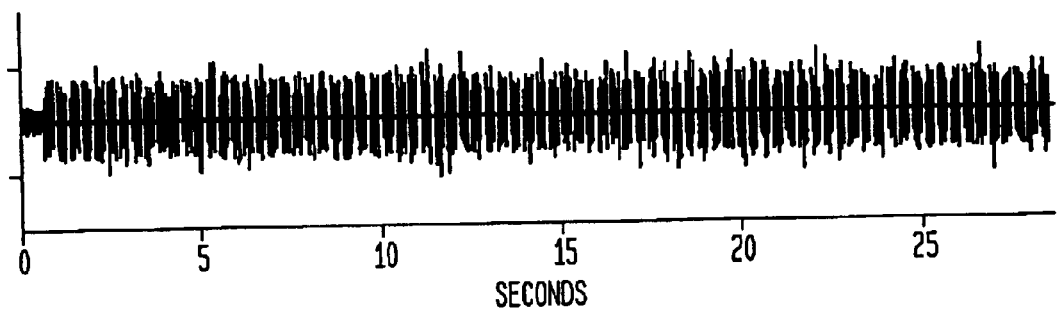
FIGS. 27(a) to 27(c) are a group of graphical signal representations for a group of signals used for a second test of a second embodiment of the present invention; Signal Test 3b. (a) Far-end signal. (b) Echo and near-end signal. (c) Near-end signal.
Figure 27B:
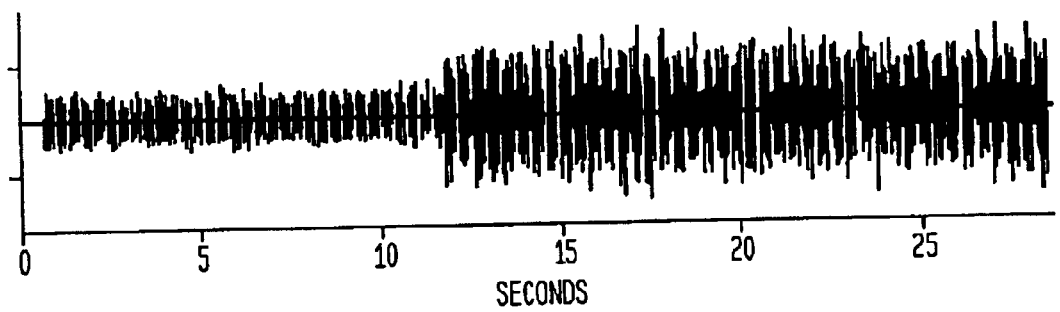
Figure 27C:
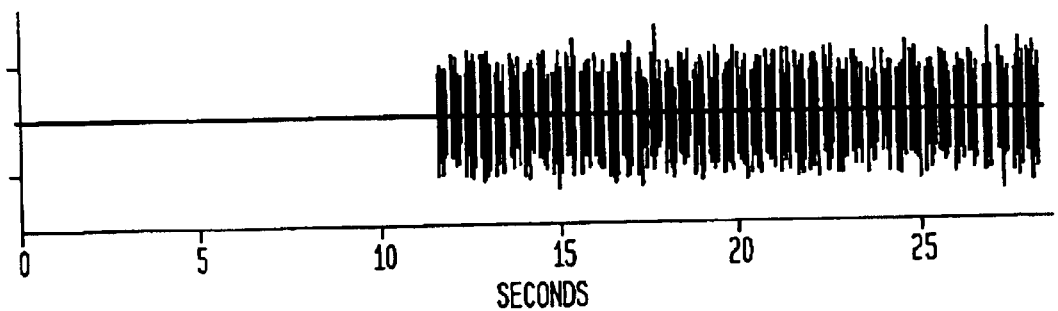
Figure 28A:
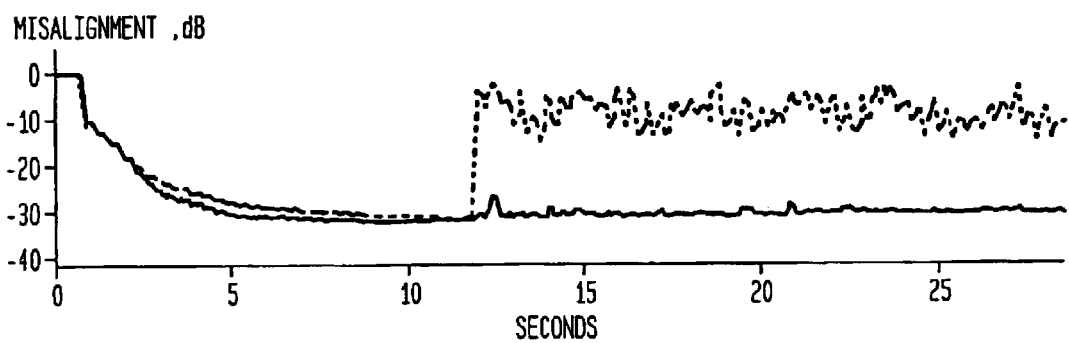
FIGS. 28(a) to 28(c) are a group of graphs indicating performance results of a second test performed on a second embodiment of the present invention; Misalignment Test 3b, hybrid in FIG. 9a (sparse) with 8 dB attenuation. (a) Solid line: Robust PNLMS++, dashed line: PNLMS++. (b) Solid line: Robust APA, dashed line: APA. (c) Solid line: Robust PAPA, dashed line: PAPA.
Figure 28B:
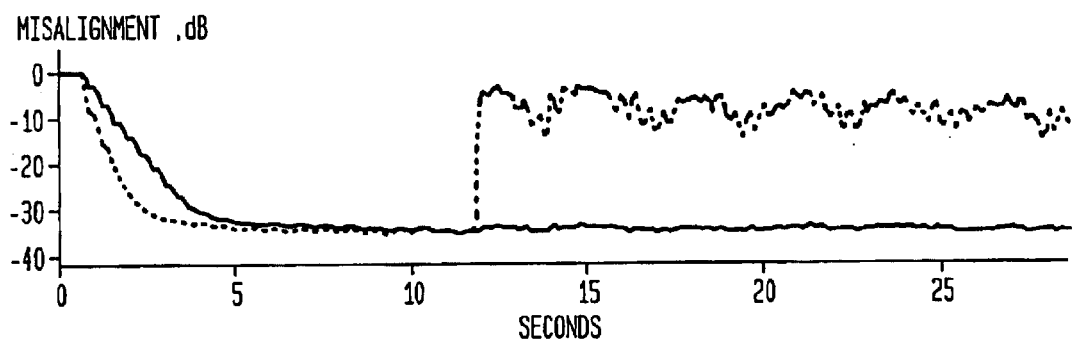
Figure 28C:
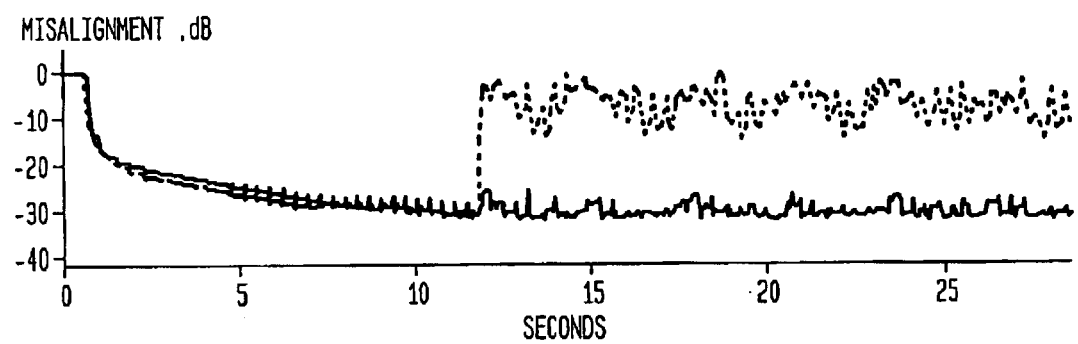
Figure 29A:
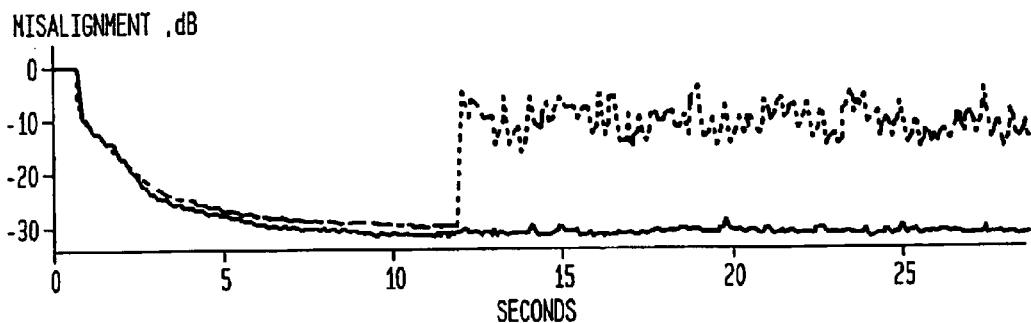
FIGS. 29(a) to 29(c) are a further group of graphs indicating performance results of a second test performed on a second embodiment of the present invention; Misalignment Test 3b, hybrid in FIG. 9a (sparse) with 6 dB attenuation. (a) Solid line: Robust PNLMS++, dashed line: PNLMS++. (b) Solid line: Robust APA. dashed line: APA. (c) Solid line: Robust PAPA, dashed line: PAPA.
Figure 29B:
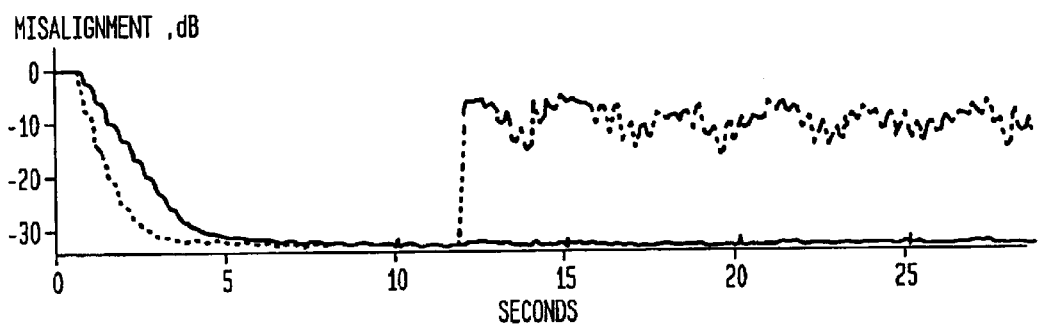
Figure 29C:
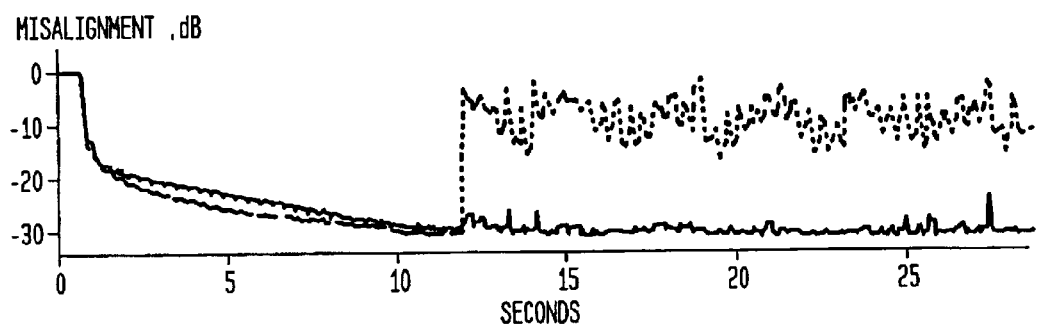
Figure 30A:
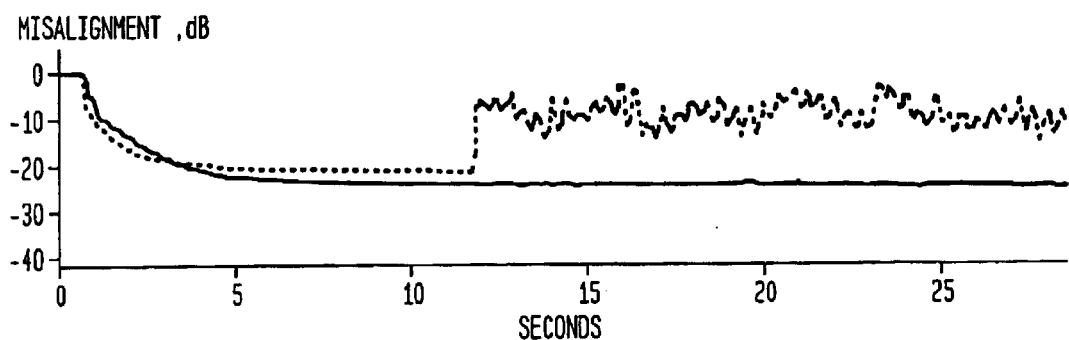
FIGS. 30(a) to 30(c) are a further group of graphs indicating performance results of a second test performed on a second embodiment of the present invention; Misalignment Test 3b, hybrid in FIG. 9c (dispersive) with 8 dB attenuation, (a) Solid line: Robust PNLMS++, dashed line: PNLMS++. (b) Solid line: Robust APA, dashed line: APA. (c) Solid line: Robust PAPA, dashed line: PAPA.
Figure 30B:
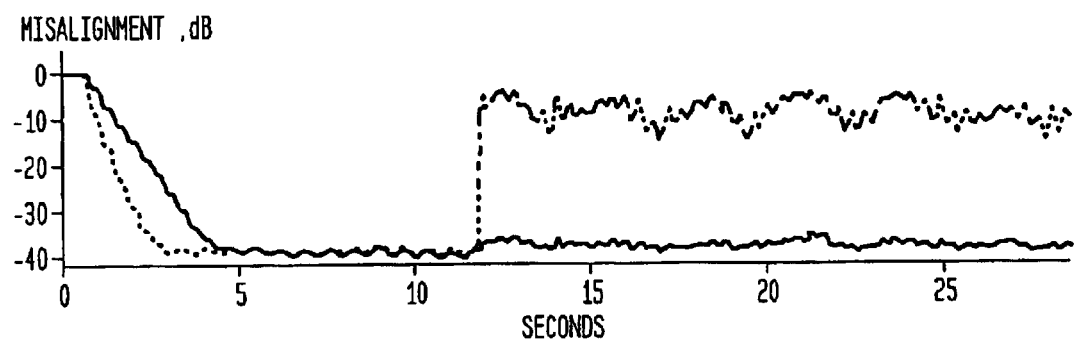
Figure 30C:
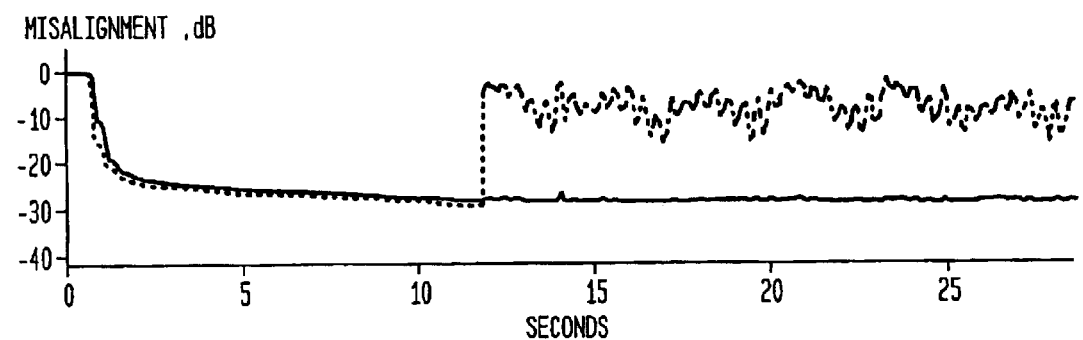
Figure 31A:
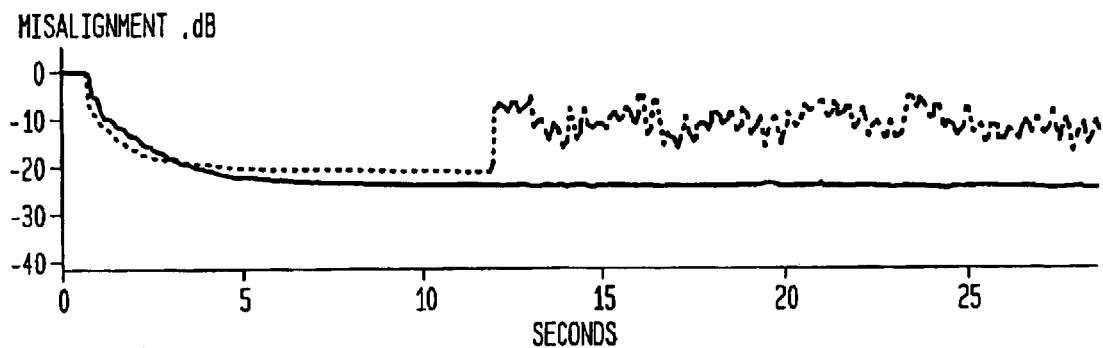
FIGS. 31(a) to 31(c) are a further group of graphs indicating performance results of a second test performed on a second embodiment of the present invention; Misalignment Test 3b, hybrid in FIG. 9c (dispersive) with 6 dB attenuation. (a) Solid line: Robust PNLMS++, dashed line: PNLMS++. (b) Solid line: Robust APA, dashed line: APA. (c) Solid line: Robust PAPA, dashed line: PAPA.
Figure 31B:
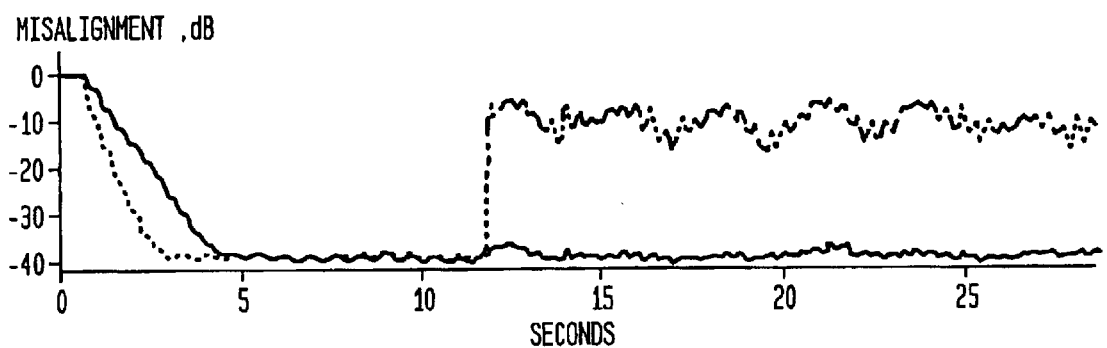
Figure 31C:
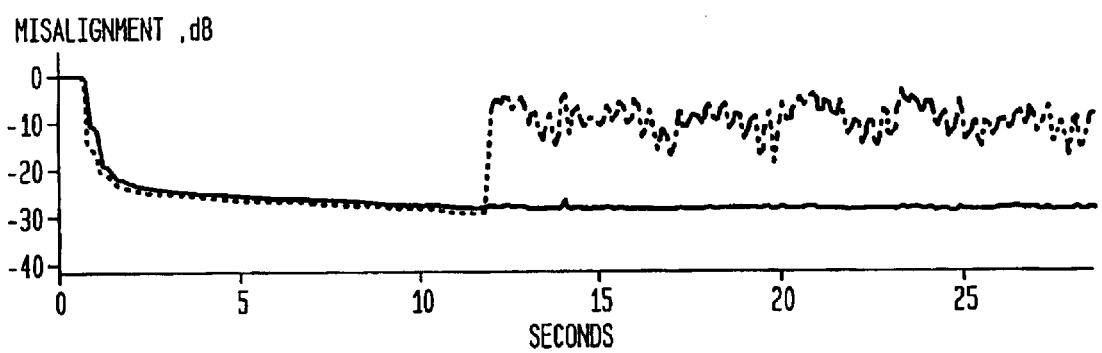
Figure 32A:
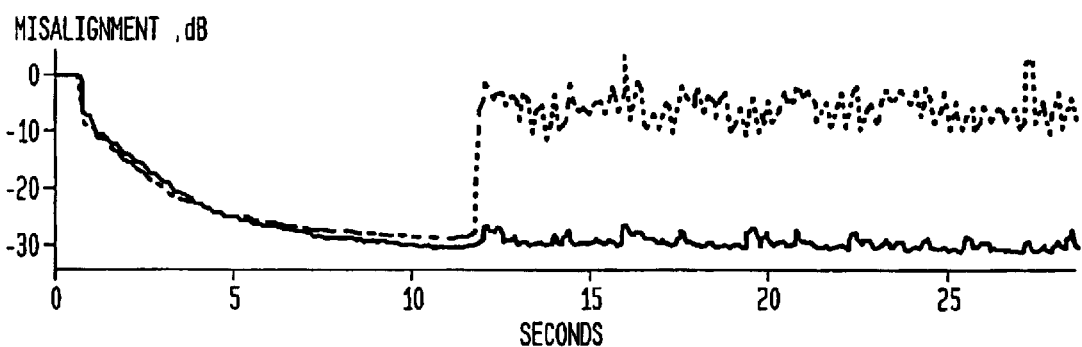
FIGS. 32(a) to 32(c) are a further group of graphs indicating performance results of a second test performed on a second embodiment of the present invention; Misalignment Test 3b, hybrid in FIG. 9e (three short reflections) with 11 dB attenuation. (a) Solid line: Robust PNLMS++, dashed line: PNLMS++. (b) Solid line: Robust APA, dashed line: APA. (c) Solid line: Robust PAPA, dashed line: PAPA.
Figure 32B:
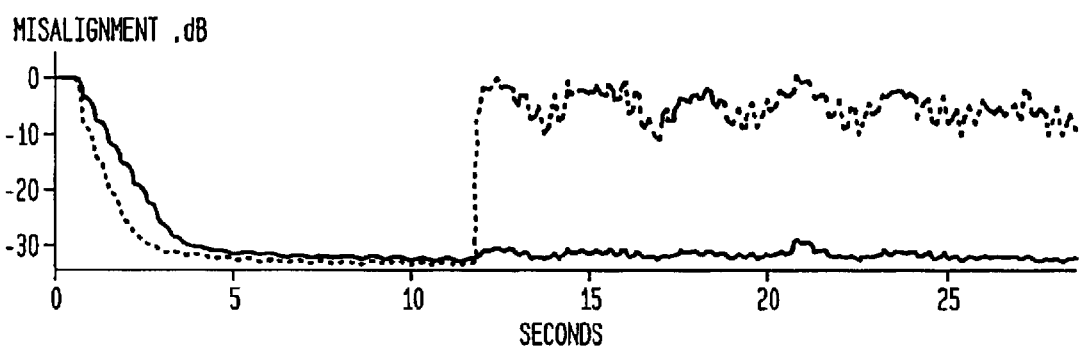
Figure 32C:
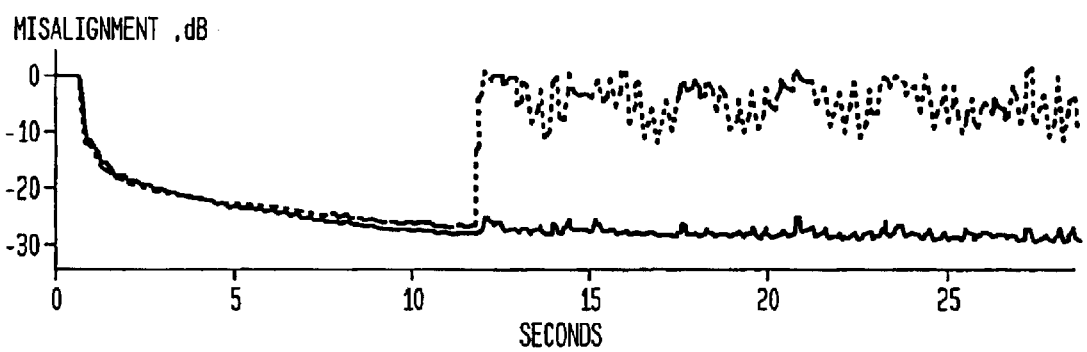

Multiple tests were carried out using three kinds of hybrids, a sparse, a dispersive and a multireflection system. FIG. 20 shows these impulse responses and their magnitude functions. Far- and near-end signals (CSS) used in Test 3A are shown in FIG. 21. During the first 625 ms the far-end signal is white noise and the near-end signal is zero. This drives the echo canceller 10 to an initial state with zero coefficients and the excitation vector is filled with non-zeros samples. The settings of initial variables do not influence the convergence rate hence the "true" convergence rate is seen when adaptation begins at 625 ms. FIGS. 22–26 show that for the parameter settings chosen, the change of hybrid attenuation does not seem to influence the performance of the algorithms. PAPA and R-PAPA are least sensitive to changes of sparseness of the responses, as recognized by comparing FIG. 22 and 24. These algorithms have superior convergence rate compared to the others. All robust algorithms have better average steady-state performance (i.e. their average, misalignments are lower) than their respective non-robust versions.

Far- and near-end signals used in Test 3B are shown in FIG. 16. Double-talk starts after about 12 seconds. Misalignments of the six algorithms are shown in FIGS. 28–32. All three robust algorithms handle the double-talk period without any degradation of misalignment while non-robust algorithms, despite the Geigel detector, diverge up to 30 dB. This divergence occurs when the DTD falls to detect the double-talk and as few as three samples are enough to drive the hybrid estimate far from optimum. The lengths of undetected bursts in these simulations range from a few up to a couple of hundred samples. The difference in convergence rate between the algorithms is also more clearly seen in this example.

Thus, based upon the above, the person of skill will recognize that the appropriate variables can be adjusted to accommodate differing application needs. For example, to increase robustness, one could increase $\lambda$ and decrease $k_o$. To increase the speed of convergence, decrease $\lambda$ and increase $k_o$. Moreover, it will also be recognized that the present invention will still provide fast convergence and robustness in the event that perturbations are caused by changes in the system to which it is applied, such as changes in the filter characteristic of the device that the fast impulse response filter is trying to emulate and cancel.

It will be further recognized by those of skill in the art that the system of FIGS. 1–3 and/or components thereof can be implemented on a general purpose digital computer using appropriate software to provide updating of the coefficients as shown herein and other digital filtering and processing functions. Alternatively, the system or its individual components may be implemented on one or more integrated circuits chips having software burned or stored therein for providing the functionality herein described. In a preferred embodiment, the device is a programmable integrated circuit or a programmable logic array. Of course, it will be recognized, that the entire circuit of FIGS. 1–3 or parts thereof may also be implemented in a digital signal processor (DSP), that could perform all or part of the functions described herein. Moreover, while the inventive system described and shown herein has been described in the context of a telephone network, it will be recognized by those of skill in the art that such signal processing techniques can be applied in other fields of endeavor, such as analog and/or digital audio or video, noise cancellation, telephone instruments, conference telephones, radio frequency microwave or optical communications, or any other field of endeavor requiring adaptive filtering.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. An adaptive filter comprising:
a finite impulse response filter; and
a coefficient vector update device connected to said finite impulse response filter for feeding adaptive coefficients in accordance with the application of a fast converging adaptive filter algorithm to said filter in response to samples of a received error signal, said update device alternately applying a PNLMS algorithm and an APA algorithm at each successive sample of said error signal.

2. An echo canceller for a telephone network, comprising:
a finite impulse response filter connected to said telephone circuit; and
a coefficient vector update device connected to said finite impulse response filter for feeding adaptive coefficients in accordance with the application of a fast converging adaptive filter algorithm to said filter in response to samples of a received echo signal, said update device alternately applying a PNLMS algorithm and an APA algorithm at each successive sample of said echo signal; and
a double talk detector connected to said telephone circuit for disabling said update device in response to the detection of double talk on said circuit.

3. An adaptive filter comprising:
a finite impulse response filter; and
a coefficient vector update device connected said finite impulse response filter for feeding adaptive coefficients thereto in response to a received error signal, said coefficients given by $$h_{n+1}=h_n+\mu G_n X_n (X_n^T X_n + \delta I)^{-1} e_n, \text{ and}$$

$$R_{xx,n}^{-1} = \begin{bmatrix} r11,n & r12,n \\ r12,n & r22,n \end{bmatrix}^{-1} = (X_n^T X_n + \delta I)^{-1},$$

where h is an estimated echo path vector, $\mu$ is a step size variable, G is a diagonal matrix that dynamically adjusts step-sizes of individual filter taps, X is an excitation matrix, $\delta$ is a parameter that prevents division by zero, I is the identity matrix, e is a residual echo vector, $R_{xx}$ is a correlation matrix, r is a correlation coefficient, and x and n are integers, wherein the matrix G has diagonal elements calculated by the equations:

$$G_n = \text{diag}\{g_{0,n}, \ldots, g_{L-1,n}\},$$
$$L_{max} = \max\{\delta_p, |h_{o,n-1}|, \ldots, |h_{L-1,n-1}|\},$$
$$\gamma_i = \max\{\rho L_{max}, |h_{i,n-1}|\}, 0 \leq i \leq L-1,$$

$$L_1 = \sum_{i=0}^{L-1} \gamma_i,$$

$$g_i = \gamma_i / L_1$$

where $\delta_p$ and $\rho$ are positive numbers.

4. An adaptive filter comprising:
a finite impulse response filter; and
a coefficient vector update device connected to said finite impulse response filter for feeding adaptive coefficients in accordance with the application of a fast conversing adaptive filter algorithm to said filter in response to samples of a received error signal, said update device applying a proportional affine projection algorithm where the proportional affine projection algorithm uses adaptive filter coefficients defined by:

$$h_{n+1}=h_n+\mu G_n X_n (X_n^T X_n + \delta I)^{-1} e_n, \text{ and}$$

$$R_{xx,n}^{-1} = \begin{bmatrix} r11,n & r12,n \\ r12,n & r22,n \end{bmatrix}^{-1} = (X_n^T X_n + \delta I)^{-1},$$

where h is an estimated echo path vector, $\mu$ is a step size variable, G is a diagonal matrix that dynamically adjusts step-sizes of individual filter taps, X is an excitation matrix, $\delta$ is a parameter that prevents division by zero, I is the identity matrix, e is a residual echo vector, $R_{xx}$ is a correlation matrix, r is a correlation coefficient, and x and n are integers, wherein the matrix G has diagonal elements calculated by the equations:

$$G_n = \text{diag}\{g_{0,n}, \ldots, g_{L-1,n}\},$$

$$L_{max} = \max\{\delta_p |h_{o,n-1}|, \ldots, |h_{l-1,n-1}|\},$$

$$\gamma_i = \max\{\rho L_{max}, |h_{i,n-1}|\}, \; 0 \leq i \leq L-1,$$

$$L_1 = \sum_{i=0}^{L-1} \gamma_i,$$

$$g_i = \gamma_i / L_1$$

where $\delta_p$ and $\rho$ are positive numbers.

5. An echo canceller for a telephone network, comprising:
a finite impulse response filter connected to telephone circuit; and
a coefficient vector update device connected top said finite impulse response filter for feeding adaptive coefficients in accordance with the application of a fast converging adaptive filter algorithm to said filter in response to samples of a received echo signal, said update device applying a proportional affine projection algorithm; and
a double talk detector connected to said telephone circuit for disabling said update device in response to the detection of double talk on said circuit, where the proportional affine projection algorithm uses adaptive filter coefficients defined by:

$$h_{n+1} = h_n + \mu G_n X_n (X_n^T X_n + \delta I)^{-1} e_n, \text{ and}$$

$$R_{xx,n}^{-1} = \begin{bmatrix} r11,n & r12,n \\ r12,n & r22,n \end{bmatrix}^{-1} = (X_n^T X_n + \delta I)^{-1},$$

where h is an estimated echo path vector, $\mu$ is a step size variable, G is a diagonal matrix that dynamically adjusts step-sizes of individual filter taps, X is an excitation matrix, $\delta$ is a parameter that prevents division by zero, I is the identity matrix, e is a residual echo vector, $R_{xx}$ is a correlation matrix, r is a correlation coefficient, and x and n are integers, wherein the matrix G has diagonal elements calculated by the equations:

$$G_n = \text{diag}\{g_{0,n}, \ldots, g_{L-1,n}\},$$

$$L_{max} = \max\{\delta_p |h_{o,n-1}|, \ldots, |h_{l-1,n-1}|\},$$

$$\gamma_i = \max\{\rho L_{max}, |h_{i,n-1}|\}, \; 0 \leq i \leq L-1,$$

$$L_1 = \sum_{i=0}^{L-1} \gamma_i,$$

$$g_i = \gamma_i / L_1$$

where $\delta_p$ and $\rho$ are positive numbers.

* * * * *